United States Patent
Tai et al.

(10) Patent No.: US 9,454,420 B1
(45) Date of Patent: Sep. 27, 2016

(54) METHOD AND SYSTEM OF READING THRESHOLD VOLTAGE EQUALIZATION

(71) Applicant: SanDisk Enterprise IP LLC, Milpitas, CA (US)

(72) Inventors: Ying Yu Tai, Mountain View, CA (US); Seungjune Jeon, Milpitas, CA (US); Jinagli Zhu, Sunnyvale, CA (US); Yeuh Yale Ma, Palo Alto, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 13/831,697

(22) Filed: Mar. 15, 2013

Related U.S. Application Data

(60) Provisional application No. 61/747,760, filed on Dec. 31, 2012.

(51) Int. Cl.
*G06F 11/08* (2006.01)
*G06F 11/07* (2006.01)
(Continued)

(52) U.S. Cl.
CPC ......... *G06F 11/073* (2013.01); *G11C 16/3404* (2013.01); *G06F 11/1008* (2013.01); *G06F 11/1068* (2013.01); *G11C 16/26* (2013.01); *G11C 16/34* (2013.01)

(58) Field of Classification Search
CPC .............. G11C 16/34; G11C 16/3404; G11C 16/3409; G11C 16/3413; G11C 16/26; G06F 11/1008; G06F 11/1068
USPC ............. 714/773, 763, 718, 721; 365/185.24
See application file for complete search history.

(56) References Cited

U.S. PATENT DOCUMENTS

| 4,173,737 A | 11/1979 | Skerlos et al. |
| 4,888,750 A | 12/1989 | Kryder et al. |

(Continued)

FOREIGN PATENT DOCUMENTS

| EP | 1 299 800 | 4/2003 |
| EP | 1465203 A1 | 10/2004 |

(Continued)

OTHER PUBLICATIONS

Barr, Introduction to Watchdog Timers, Oct. 2001, 3 pgs.

(Continued)

*Primary Examiner* — Albert Decady
*Assistant Examiner* — Christian Dorman
(74) *Attorney, Agent, or Firm* — Morgan, Lewis & Bockius LLP

(57) ABSTRACT

The various implementations described herein include systems, methods and/or devices that may enhance the reliability with which data can be stored in and read from a memory. The method includes, in response to one or more host read commands, reading data from a set of memory cells in a flash memory array in accordance with a first reading threshold voltage and performing an error correction process on the read data to produce error correction information. The method further includes determining, based on the error correction information, whether to adjust the first reading threshold voltage, and upon determining to adjust the first reading threshold voltage, setting the value of the first reading threshold voltage to a value greater or less than a current value of the first reading threshold voltage. In some implementations, the method further includes initiating a recalibration of the first reading threshold voltage when a predefined condition occurs.

18 Claims, 7 Drawing Sheets

(51) Int. Cl.
  *G11C 16/34* (2006.01)
  *G06F 11/10* (2006.01)
  *G11C 16/26* (2006.01)

(56) References Cited

U.S. PATENT DOCUMENTS

| | | | |
|---|---|---|---|
| 4,916,652 A | 4/1990 | Schwarz et al. |
| 5,129,089 A | 7/1992 | Nielsen |
| 5,270,979 A | 12/1993 | Harari et al. |
| 5,329,491 A | 7/1994 | Brown et al. |
| 5,381,528 A | 1/1995 | Brunelle |
| 5,404,485 A | 4/1995 | Ban |
| 5,519,847 A | 5/1996 | Fandrich et al. |
| 5,530,705 A | 6/1996 | Malone, Sr. |
| 5,537,555 A | 7/1996 | Landry et al. |
| 5,551,003 A | 8/1996 | Mattson et al. |
| 5,636,342 A | 6/1997 | Jeffries |
| 5,657,332 A | 8/1997 | Auclair et al. |
| 5,666,114 A | 9/1997 | Brodie et al. |
| 5,708,849 A | 1/1998 | Coke et al. |
| 5,765,185 A | 6/1998 | Lambrache et al. |
| 5,890,193 A | 3/1999 | Chevallier |
| 5,936,884 A | 8/1999 | Hasbun et al. |
| 5,943,692 A | 8/1999 | Marberg et al. |
| 5,946,714 A | 8/1999 | Miyauchi |
| 5,982,664 A | 11/1999 | Watanabe |
| 6,000,006 A | 12/1999 | Bruce et al. |
| 6,006,345 A | 12/1999 | Berry, Jr. |
| 6,016,560 A | 1/2000 | Wada et al. |
| 6,018,304 A | 1/2000 | Bessios |
| 6,044,472 A | 3/2000 | Crohas |
| 6,070,074 A | 5/2000 | Perahia et al. |
| 6,119,250 A | 9/2000 | Nishimura et al. |
| 6,138,261 A | 10/2000 | Wilcoxson et al. |
| 6,182,264 B1 | 1/2001 | Ott |
| 6,192,092 B1 | 2/2001 | Dizon et al. |
| 6,260,120 B1 | 7/2001 | Blumenau et al. |
| 6,295,592 B1 | 9/2001 | Jeddeloh |
| 6,311,263 B1 | 10/2001 | Barlow et al. |
| 6,408,394 B1 | 6/2002 | Vander Kamp et al. |
| 6,412,042 B1 | 6/2002 | Paterson et al. |
| 6,442,076 B1 | 8/2002 | Roohparvar |
| 6,449,625 B1 | 9/2002 | Wang |
| 6,484,224 B1 | 11/2002 | Robins et al. |
| 6,516,437 B1 | 2/2003 | Van Stralen et al. |
| 6,564,285 B1 | 5/2003 | Mills et al. |
| 6,647,387 B1 | 11/2003 | McKean et al. |
| 6,678,788 B1 | 1/2004 | O'Connell |
| 6,757,768 B1 | 6/2004 | Potter et al. |
| 6,775,792 B2 | 8/2004 | Ulrich et al. |
| 6,810,440 B2 | 10/2004 | Micalizzi, Jr. et al. |
| 6,836,808 B2 | 12/2004 | Bunce et al. |
| 6,836,815 B1 | 12/2004 | Purcell et al. |
| 6,842,436 B2 | 1/2005 | Moeller |
| 6,865,650 B1 | 3/2005 | Morley et al. |
| 6,871,257 B2 | 3/2005 | Conley et al. |
| 6,895,464 B2 | 5/2005 | Chow et al. |
| 6,966,006 B2 | 11/2005 | Pacheco et al. |
| 6,978,343 B1 | 12/2005 | Ichiriu |
| 6,980,985 B1 | 12/2005 | Amer-Yahia et al. |
| 6,981,205 B2 | 12/2005 | Fukushima et al. |
| 6,988,171 B2 | 1/2006 | Beardsley et al. |
| 7,020,017 B2 | 3/2006 | Chen et al. |
| 7,024,514 B2 | 4/2006 | Mukaida et al. |
| 7,028,165 B2 | 4/2006 | Roth et al. |
| 7,032,123 B2 | 4/2006 | Kane et al. |
| 7,043,505 B1 | 5/2006 | Teague et al. |
| 7,076,598 B2 | 7/2006 | Wang |
| 7,100,002 B2 | 8/2006 | Shrader |
| 7,102,860 B2 | 9/2006 | Wenzel |
| 7,111,293 B1 | 9/2006 | Hersh et al. |
| 7,126,873 B2 | 10/2006 | See et al. |
| 7,133,282 B2 | 11/2006 | Sone |
| 7,155,579 B1 | 12/2006 | Neils et al. |
| 7,162,678 B2 | 1/2007 | Saliba |
| 7,173,852 B2 | 2/2007 | Gorobets et al. |
| 7,184,446 B2 | 2/2007 | Rashid et al. |
| 7,212,440 B2 | 5/2007 | Gorobets |
| 7,275,170 B2 | 9/2007 | Suzuki |
| 7,295,479 B2 | 11/2007 | Yoon et al. |
| 7,328,377 B1 | 2/2008 | Lewis et al. |
| 7,516,292 B2 | 4/2009 | Kimura et al. |
| 7,523,157 B2 | 4/2009 | Aguilar, Jr. et al. |
| 7,527,466 B2 | 5/2009 | Simmons |
| 7,529,466 B2 | 5/2009 | Takahashi |
| 7,533,214 B2 | 5/2009 | Aasheim et al. |
| 7,546,478 B2 | 6/2009 | Kubo et al. |
| 7,566,987 B2 | 7/2009 | Black et al. |
| 7,571,277 B2 | 8/2009 | Mizushima |
| 7,574,554 B2 | 8/2009 | Tanaka et al. |
| 7,596,643 B2 | 9/2009 | Merry, Jr. et al. |
| 7,669,003 B2 | 2/2010 | Sinclair et al. |
| 7,681,106 B2 | 3/2010 | Jarrar et al. |
| 7,685,494 B1 | 3/2010 | Varnica et al. |
| 7,707,481 B2 | 4/2010 | Kirschner et al. |
| 7,761,655 B2 | 7/2010 | Mizushima et al. |
| 7,765,454 B2 | 7/2010 | Passint |
| 7,774,390 B2 | 8/2010 | Shin |
| 7,840,762 B2 | 11/2010 | Oh et al. |
| 7,870,326 B2 | 1/2011 | Shin et al. |
| 7,890,818 B2 | 2/2011 | Kong et al. |
| 7,913,022 B1 | 3/2011 | Baxter |
| 7,925,960 B2 | 4/2011 | Ho et al. |
| 7,934,052 B2 | 4/2011 | Prins et al. |
| 7,945,825 B2 | 5/2011 | Cohen et al. |
| 7,954,041 B2 | 5/2011 | Hong et al. |
| 7,971,112 B2 | 6/2011 | Murata |
| 7,974,368 B2 | 7/2011 | Shieh et al. |
| 7,978,516 B2 | 7/2011 | Olbrich et al. |
| 7,996,642 B1 | 8/2011 | Smith |
| 8,006,161 B2 | 8/2011 | Lestable et al. |
| 8,032,724 B1 | 10/2011 | Smith |
| 8,041,884 B2 | 10/2011 | Chang |
| 8,042,011 B2 | 10/2011 | Nicolaidis et al. |
| 8,069,390 B2 | 11/2011 | Lin |
| 8,190,967 B2 | 5/2012 | Hong et al. |
| 8,250,380 B2 | 8/2012 | Guyot |
| 8,254,181 B2 | 8/2012 | Hwang et al. |
| 8,259,506 B1 * | 9/2012 | Sommer et al. ......... 365/185.24 |
| 8,312,349 B2 | 11/2012 | Reche et al. |
| 8,412,985 B1 | 4/2013 | Bowers et al. |
| 8,429,436 B2 | 4/2013 | Fillingim et al. |
| 8,438,459 B2 | 5/2013 | Cho et al. |
| 8,453,022 B2 | 5/2013 | Katz |
| 8,627,117 B2 | 1/2014 | Johnston |
| 8,634,248 B1 | 1/2014 | Sprouse et al. |
| 8,694,854 B1 | 4/2014 | Dar et al. |
| 8,724,789 B2 | 5/2014 | Altberg et al. |
| 8,832,384 B1 | 9/2014 | de la Iglesia |
| 8,885,434 B2 | 11/2014 | Kumar |
| 8,898,373 B1 | 11/2014 | Kang et al. |
| 8,909,894 B1 | 12/2014 | Singh et al. |
| 8,910,030 B2 | 12/2014 | Goel |
| 8,923,066 B1 | 12/2014 | Subramanian et al. |
| 9,043,517 B1 | 5/2015 | Sprouse et al. |
| 9,128,690 B2 | 9/2015 | Lotzenburger et al. |
| 2001/0050824 A1 | 12/2001 | Buch |
| 2002/0024846 A1 | 2/2002 | Kawahara et al. |
| 2002/0036515 A1 | 3/2002 | Eldridge et al. |
| 2002/0083299 A1 | 6/2002 | Van Huben et al. |
| 2002/0099904 A1 | 7/2002 | Conley |
| 2002/0116651 A1 | 8/2002 | Beckert et al. |
| 2002/0122334 A1 | 9/2002 | Lee et al. |
| 2002/0152305 A1 | 10/2002 | Jackson et al. |
| 2002/0162075 A1 | 10/2002 | Talagala et al. |
| 2002/0165896 A1 | 11/2002 | Kim |
| 2003/0041299 A1 | 2/2003 | Kanazawa et al. |
| 2003/0043829 A1 | 3/2003 | Rashid et al. |
| 2003/0079172 A1 | 4/2003 | Yamagishi et al. |
| 2003/0088805 A1 | 5/2003 | Majni et al. |
| 2003/0093628 A1 | 5/2003 | Matter et al. |
| 2003/0163594 A1 | 8/2003 | Aasheim et al. |
| 2003/0163629 A1 | 8/2003 | Conley et al. |
| 2003/0188045 A1 | 10/2003 | Jacobson |

(56) References Cited

U.S. PATENT DOCUMENTS

| | | |
|---|---|---|
| 2003/0189856 A1 | 10/2003 | Cho et al. |
| 2003/0198100 A1 | 10/2003 | Matsushita et al. |
| 2003/0204341 A1 | 10/2003 | Guliani et al. |
| 2003/0212719 A1 | 11/2003 | Yasuda et al. |
| 2003/0225961 A1 | 12/2003 | Chow et al. |
| 2004/0024957 A1 | 2/2004 | Lin et al. |
| 2004/0024963 A1 | 2/2004 | Talagala et al. |
| 2004/0057575 A1 | 3/2004 | Zhang et al. |
| 2004/0062157 A1 | 4/2004 | Kawabe |
| 2004/0073829 A1 | 4/2004 | Olarig |
| 2004/0085849 A1 | 5/2004 | Myoung et al. |
| 2004/0114265 A1 | 6/2004 | Talbert |
| 2004/0143710 A1 | 7/2004 | Walmsley |
| 2004/0148561 A1 | 7/2004 | Shen et al. |
| 2004/0153902 A1 | 8/2004 | Machado et al. |
| 2004/0167898 A1 | 8/2004 | Margolus et al. |
| 2004/0181734 A1 | 9/2004 | Saliba |
| 2004/0199714 A1 | 10/2004 | Estakhri et al. |
| 2004/0210706 A1 | 10/2004 | In et al. |
| 2004/0237018 A1 | 11/2004 | Riley |
| 2005/0060456 A1 | 3/2005 | Shrader et al. |
| 2005/0060501 A1 | 3/2005 | Shrader |
| 2005/0073884 A1 | 4/2005 | Gonzalez et al. |
| 2005/0108588 A1 | 5/2005 | Yuan |
| 2005/0114587 A1 | 5/2005 | Chou et al. |
| 2005/0138442 A1 | 6/2005 | Keller, Jr. et al. |
| 2005/0144358 A1 | 6/2005 | Conley et al. |
| 2005/0144361 A1 | 6/2005 | Gonzalez et al. |
| 2005/0144367 A1 | 6/2005 | Sinclair |
| 2005/0144516 A1 | 6/2005 | Gonzalez et al. |
| 2005/0154825 A1 | 7/2005 | Fair |
| 2005/0172065 A1 | 8/2005 | Keays |
| 2005/0172207 A1 | 8/2005 | Radke et al. |
| 2005/0193161 A1 | 9/2005 | Lee et al. |
| 2005/0201148 A1 | 9/2005 | Chen et al. |
| 2005/0231765 A1 | 10/2005 | So et al. |
| 2005/0249013 A1 | 11/2005 | Janzen et al. |
| 2005/0251617 A1 | 11/2005 | Sinclair et al. |
| 2005/0257120 A1 | 11/2005 | Gorobets et al. |
| 2005/0273560 A1 | 12/2005 | Hulbert et al. |
| 2005/0281088 A1 | 12/2005 | Ishidoshiro et al. |
| 2005/0289314 A1 | 12/2005 | Adusumilli et al. |
| 2006/0010174 A1 | 1/2006 | Nguyen et al. |
| 2006/0039196 A1 | 2/2006 | Gorobets et al. |
| 2006/0039227 A1 | 2/2006 | Lai et al. |
| 2006/0053246 A1 | 3/2006 | Lee |
| 2006/0069932 A1 | 3/2006 | Oshikawa et al. |
| 2006/0085671 A1 | 4/2006 | Majni et al. |
| 2006/0087893 A1 | 4/2006 | Nishihara et al. |
| 2006/0103480 A1 | 5/2006 | Moon et al. |
| 2006/0107181 A1 | 5/2006 | Dave et al. |
| 2006/0136570 A1 | 6/2006 | Pandya |
| 2006/0136655 A1 | 6/2006 | Gorobets et al. |
| 2006/0136681 A1 | 6/2006 | Jain et al. |
| 2006/0156177 A1 | 7/2006 | Kottapalli et al. |
| 2006/0195650 A1 | 8/2006 | Su et al. |
| 2006/0244049 A1 | 11/2006 | Yaoi et al. |
| 2006/0259528 A1 | 11/2006 | Dussud et al. |
| 2006/0291301 A1 | 12/2006 | Ziegelmayer |
| 2007/0011413 A1 | 1/2007 | Nonaka et al. |
| 2007/0058446 A1 | 3/2007 | Hwang et al. |
| 2007/0061597 A1 | 3/2007 | Holtzman et al. |
| 2007/0076479 A1 | 4/2007 | Kim et al. |
| 2007/0081408 A1 | 4/2007 | Kwon et al. |
| 2007/0083697 A1 | 4/2007 | Birrell et al. |
| 2007/0088716 A1 | 4/2007 | Brumme et al. |
| 2007/0091677 A1 | 4/2007 | Lasser et al. |
| 2007/0101096 A1 | 5/2007 | Gorobets |
| 2007/0113019 A1 | 5/2007 | Beukema et al. |
| 2007/0133312 A1 | 6/2007 | Roohparvar |
| 2007/0147113 A1 | 6/2007 | Mokhlesi et al. |
| 2007/0150790 A1 | 6/2007 | Gross et al. |
| 2007/0156842 A1 | 7/2007 | Vermeulen et al. |
| 2007/0157064 A1 | 7/2007 | Falik et al. |
| 2007/0174579 A1 | 7/2007 | Shin |
| 2007/0180188 A1 | 8/2007 | Fujibayashi et al. |
| 2007/0180346 A1 | 8/2007 | Murin |
| 2007/0191993 A1 | 8/2007 | Wyatt |
| 2007/0201274 A1 | 8/2007 | Yu et al. |
| 2007/0204128 A1 | 8/2007 | Lee et al. |
| 2007/0208901 A1 | 9/2007 | Purcell et al. |
| 2007/0234143 A1 | 10/2007 | Kim |
| 2007/0245061 A1 | 10/2007 | Harriman |
| 2007/0245099 A1 | 10/2007 | Gray et al. |
| 2007/0263442 A1 | 11/2007 | Cornwell et al. |
| 2007/0268754 A1 | 11/2007 | Lee et al. |
| 2007/0277036 A1 | 11/2007 | Chamberlain et al. |
| 2007/0279988 A1 | 12/2007 | Nguyen |
| 2007/0291556 A1 | 12/2007 | Kamei |
| 2007/0294496 A1 | 12/2007 | Goss et al. |
| 2007/0300130 A1 | 12/2007 | Gorobets |
| 2008/0013390 A1 | 1/2008 | Zipprich-Rasch |
| 2008/0019182 A1 | 1/2008 | Yanagidaira et al. |
| 2008/0022163 A1 | 1/2008 | Tanaka et al. |
| 2008/0028275 A1 | 1/2008 | Chen et al. |
| 2008/0043871 A1 | 2/2008 | Latouche et al. |
| 2008/0052446 A1 | 2/2008 | Lasser et al. |
| 2008/0052451 A1 | 2/2008 | Pua et al. |
| 2008/0056005 A1 | 3/2008 | Aritome |
| 2008/0059602 A1 | 3/2008 | Matsuda et al. |
| 2008/0071971 A1 | 3/2008 | Kim et al. |
| 2008/0077841 A1 | 3/2008 | Gonzalez et al. |
| 2008/0077937 A1 | 3/2008 | Shin et al. |
| 2008/0086677 A1 | 4/2008 | Yang et al. |
| 2008/0112226 A1 | 5/2008 | Mokhlesi |
| 2008/0141043 A1 | 6/2008 | Flynn et al. |
| 2008/0144371 A1 | 6/2008 | Yeh et al. |
| 2008/0147714 A1 | 6/2008 | Breternitz et al. |
| 2008/0147964 A1 | 6/2008 | Chow et al. |
| 2008/0147998 A1 | 6/2008 | Jeong |
| 2008/0148124 A1 | 6/2008 | Zhang et al. |
| 2008/0163030 A1 | 7/2008 | Lee |
| 2008/0168191 A1 | 7/2008 | Biran et al. |
| 2008/0168319 A1 | 7/2008 | Lee et al. |
| 2008/0170460 A1 | 7/2008 | Oh et al. |
| 2008/0229000 A1 | 9/2008 | Kim |
| 2008/0229003 A1 | 9/2008 | Mizushima et al. |
| 2008/0229176 A1 | 9/2008 | Arnez et al. |
| 2008/0270680 A1 | 10/2008 | Chang |
| 2008/0282128 A1 | 11/2008 | Lee et al. |
| 2008/0285351 A1 | 11/2008 | Shlick et al. |
| 2008/0313132 A1 | 12/2008 | Hao et al. |
| 2009/0003058 A1 | 1/2009 | Kang |
| 2009/0019216 A1 | 1/2009 | Yamada et al. |
| 2009/0031083 A1 | 1/2009 | Willis et al. |
| 2009/0037652 A1 | 2/2009 | Yu et al. |
| 2009/0070608 A1 | 3/2009 | Kobayashi |
| 2009/0116283 A1 | 5/2009 | Ha et al. |
| 2009/0125671 A1 | 5/2009 | Flynn et al. |
| 2009/0144598 A1 | 6/2009 | Yoon et al. |
| 2009/0168525 A1 | 7/2009 | Olbrich et al. |
| 2009/0172258 A1 | 7/2009 | Olbrich et al. |
| 2009/0172259 A1 | 7/2009 | Prins et al. |
| 2009/0172260 A1 | 7/2009 | Olbrich et al. |
| 2009/0172261 A1 | 7/2009 | Prins et al. |
| 2009/0172262 A1 | 7/2009 | Olbrich et al. |
| 2009/0172308 A1 | 7/2009 | Prins et al. |
| 2009/0172335 A1 | 7/2009 | Kulkarni et al. |
| 2009/0172499 A1 | 7/2009 | Olbrich et al. |
| 2009/0193058 A1 | 7/2009 | Reid |
| 2009/0204823 A1 | 8/2009 | Giordano et al. |
| 2009/0207660 A1 | 8/2009 | Hwang et al. |
| 2009/0213649 A1 | 8/2009 | Takahashi et al. |
| 2009/0222708 A1 | 9/2009 | Yamaga |
| 2009/0228761 A1 | 9/2009 | Perlmutter et al. |
| 2009/0249160 A1 | 10/2009 | Gao et al. |
| 2009/0268521 A1 | 10/2009 | Ueno et al. |
| 2009/0292972 A1 | 11/2009 | Seol et al. |
| 2009/0296466 A1 | 12/2009 | Kim et al. |
| 2009/0296486 A1 | 12/2009 | Kim et al. |
| 2009/0310422 A1 | 12/2009 | Edahiro et al. |
| 2009/0319864 A1 | 12/2009 | Shrader |
| 2010/0002506 A1 | 1/2010 | Cho et al. |
| 2010/0008175 A1 | 1/2010 | Sweere et al. |

(56) References Cited

U.S. PATENT DOCUMENTS

| | | |
|---|---|---|
| 2010/0011261 A1 | 1/2010 | Cagno et al. |
| 2010/0020620 A1 | 1/2010 | Kim et al. |
| 2010/0037012 A1 | 2/2010 | Yano et al. |
| 2010/0061151 A1 | 3/2010 | Miwa et al. |
| 2010/0091535 A1* | 4/2010 | Sommer et al. ............... 365/45 |
| 2010/0103737 A1 | 4/2010 | Park |
| 2010/0110798 A1 | 5/2010 | Hoei et al. |
| 2010/0115206 A1 | 5/2010 | de la Iglesia et al. |
| 2010/0118608 A1 | 5/2010 | Song et al. |
| 2010/0138592 A1 | 6/2010 | Cheon |
| 2010/0153616 A1 | 6/2010 | Garratt |
| 2010/0161936 A1 | 6/2010 | Royer et al. |
| 2010/0174959 A1 | 7/2010 | No et al. |
| 2010/0199027 A1 | 8/2010 | Pucheral et al. |
| 2010/0199125 A1 | 8/2010 | Reche |
| 2010/0199138 A1 | 8/2010 | Rho |
| 2010/0202196 A1 | 8/2010 | Lee et al. |
| 2010/0202239 A1 | 8/2010 | Moshayedi et al. |
| 2010/0208521 A1 | 8/2010 | Kim et al. |
| 2010/0262889 A1 | 10/2010 | Bains |
| 2010/0281207 A1 | 11/2010 | Miller et al. |
| 2010/0281342 A1 | 11/2010 | Chang et al. |
| 2010/0306222 A1 | 12/2010 | Freedman et al. |
| 2010/0332858 A1 | 12/2010 | Trantham et al. |
| 2010/0332863 A1 | 12/2010 | Johnston |
| 2011/0010514 A1 | 1/2011 | Benhase et al. |
| 2011/0022779 A1 | 1/2011 | Lund et al. |
| 2011/0022819 A1 | 1/2011 | Post et al. |
| 2011/0051513 A1 | 3/2011 | Shen et al. |
| 2011/0066597 A1 | 3/2011 | Mashtizadeh et al. |
| 2011/0066806 A1 | 3/2011 | Chhugani et al. |
| 2011/0072302 A1 | 3/2011 | Sartore |
| 2011/0078407 A1 | 3/2011 | Lewis |
| 2011/0083060 A1 | 4/2011 | Sakurada et al. |
| 2011/0099460 A1 | 4/2011 | Dusija et al. |
| 2011/0113281 A1 | 5/2011 | Zhang et al. |
| 2011/0122691 A1 | 5/2011 | Sprouse |
| 2011/0131444 A1 | 6/2011 | Buch et al. |
| 2011/0138260 A1 | 6/2011 | Savin |
| 2011/0173378 A1 | 7/2011 | Filor et al. |
| 2011/0179249 A1 | 7/2011 | Hsiao |
| 2011/0199825 A1 | 8/2011 | Han et al. |
| 2011/0205823 A1 | 8/2011 | Hemink et al. |
| 2011/0213920 A1 | 9/2011 | Frost et al. |
| 2011/0222342 A1 | 9/2011 | Yoon et al. |
| 2011/0225346 A1 | 9/2011 | Goss et al. |
| 2011/0228601 A1 | 9/2011 | Olbrich et al. |
| 2011/0231600 A1 | 9/2011 | Tanaka et al. |
| 2011/0239077 A1 | 9/2011 | Bai et al. |
| 2011/0264843 A1 | 10/2011 | Haines et al. |
| 2011/0271040 A1 | 11/2011 | Kamizono |
| 2011/0283119 A1 | 11/2011 | Szu et al. |
| 2011/0289125 A1 | 11/2011 | Guthery |
| 2011/0320733 A1 | 12/2011 | Sanford et al. |
| 2012/0011393 A1 | 1/2012 | Roberts et al. |
| 2012/0017053 A1 | 1/2012 | Yang et al. |
| 2012/0023144 A1 | 1/2012 | Rub |
| 2012/0054414 A1 | 3/2012 | Tsai et al. |
| 2012/0063234 A1 | 3/2012 | Shiga et al. |
| 2012/0072639 A1 | 3/2012 | Goss et al. |
| 2012/0096217 A1 | 4/2012 | Son et al. |
| 2012/0110250 A1 | 5/2012 | Sabbag et al. |
| 2012/0117317 A1 | 5/2012 | Sheffler |
| 2012/0117397 A1 | 5/2012 | Kolvick et al. |
| 2012/0131286 A1 | 5/2012 | Faith et al. |
| 2012/0151124 A1 | 6/2012 | Baek et al. |
| 2012/0151253 A1 | 6/2012 | Horn |
| 2012/0151294 A1 | 6/2012 | Yoo et al. |
| 2012/0173797 A1 | 7/2012 | Shen |
| 2012/0173826 A1 | 7/2012 | Takaku |
| 2012/0185750 A1 | 7/2012 | Hayami |
| 2012/0195126 A1 | 8/2012 | Roohparvar |
| 2012/0203951 A1 | 8/2012 | Wood et al. |
| 2012/0210095 A1 | 8/2012 | Nellans et al. |
| 2012/0216079 A1 | 8/2012 | Fai et al. |
| 2012/0233391 A1 | 9/2012 | Frost et al. |
| 2012/0236658 A1 | 9/2012 | Byom et al. |
| 2012/0239858 A1 | 9/2012 | Melik-Martirosian |
| 2012/0239868 A1 | 9/2012 | Ryan et al. |
| 2012/0239976 A1 | 9/2012 | Cometti et al. |
| 2012/0259863 A1 | 10/2012 | Bodwin et al. |
| 2012/0275466 A1 | 11/2012 | Bhadra et al. |
| 2012/0278564 A1 | 11/2012 | Goss et al. |
| 2012/0284574 A1 | 11/2012 | Avila et al. |
| 2012/0284587 A1 | 11/2012 | Yu et al. |
| 2013/0007073 A1 | 1/2013 | Varma |
| 2013/0007343 A1 | 1/2013 | Rub et al. |
| 2013/0007543 A1 | 1/2013 | Goss et al. |
| 2013/0024735 A1 | 1/2013 | Chung et al. |
| 2013/0031438 A1 | 1/2013 | Hu et al. |
| 2013/0036418 A1 | 2/2013 | Yadappanavar et al. |
| 2013/0038380 A1 | 2/2013 | Cordero et al. |
| 2013/0047045 A1 | 2/2013 | Hu et al. |
| 2013/0070527 A1 | 3/2013 | Sabbag et al. |
| 2013/0073924 A1 | 3/2013 | D'Abreu et al. |
| 2013/0079942 A1 | 3/2013 | Smola et al. |
| 2013/0086131 A1 | 4/2013 | Hunt et al. |
| 2013/0086132 A1 | 4/2013 | Hunt et al. |
| 2013/0094288 A1 | 4/2013 | Patapoutian et al. |
| 2013/0111279 A1 | 5/2013 | Jeon et al. |
| 2013/0111298 A1 | 5/2013 | Seroff et al. |
| 2013/0117606 A1 | 5/2013 | Anholt et al. |
| 2013/0121084 A1 | 5/2013 | Jeon et al. |
| 2013/0124792 A1 | 5/2013 | Melik-Martirosian et al. |
| 2013/0124888 A1 | 5/2013 | Tanaka et al. |
| 2013/0128666 A1 | 5/2013 | Avila et al. |
| 2013/0132652 A1* | 5/2013 | Wood et al. ............... 711/103 |
| 2013/0176784 A1 | 7/2013 | Cometti et al. |
| 2013/0179646 A1 | 7/2013 | Okubo et al. |
| 2013/0191601 A1 | 7/2013 | Peterson et al. |
| 2013/0194865 A1 | 8/2013 | Bandic et al. |
| 2013/0194874 A1 | 8/2013 | Mu et al. |
| 2013/0232289 A1 | 9/2013 | Zhong et al. |
| 2013/0238576 A1 | 9/2013 | Binkert et al. |
| 2013/0254507 A1 | 9/2013 | Islam et al. |
| 2013/0258738 A1 | 10/2013 | Barkon et al. |
| 2013/0265838 A1 | 10/2013 | Li |
| 2013/0282955 A1 | 10/2013 | Parker et al. |
| 2013/0290611 A1 | 10/2013 | Biederman et al. |
| 2013/0297613 A1 | 11/2013 | Yu |
| 2013/0301373 A1 | 11/2013 | Tam |
| 2013/0304980 A1 | 11/2013 | Nachimuthu et al. |
| 2013/0343131 A1* | 12/2013 | Wu et al. ............... 365/185.24 |
| 2013/0346672 A1 | 12/2013 | Sengupta et al. |
| 2014/0013027 A1 | 1/2014 | Venkata et al. |
| 2014/0013188 A1 | 1/2014 | Wu et al. |
| 2014/0032890 A1 | 1/2014 | Lee et al. |
| 2014/0063905 A1 | 3/2014 | Ahn et al. |
| 2014/0075133 A1 | 3/2014 | Li et al. |
| 2014/0082261 A1 | 3/2014 | Cohen et al. |
| 2014/0082310 A1 | 3/2014 | Nakajima |
| 2014/0082459 A1 | 3/2014 | Li et al. |
| 2014/0095775 A1 | 4/2014 | Talagala et al. |
| 2014/0101389 A1 | 4/2014 | Nellans et al. |
| 2014/0122818 A1 | 5/2014 | Hayasaka et al. |
| 2014/0122907 A1 | 5/2014 | Johnston |
| 2014/0136762 A1 | 5/2014 | Li et al. |
| 2014/0136883 A1 | 5/2014 | Cohen |
| 2014/0136927 A1 | 5/2014 | Li et al. |
| 2014/0143505 A1 | 5/2014 | Sim et al. |
| 2014/0181458 A1 | 6/2014 | Loh et al. |
| 2014/0201596 A1 | 7/2014 | Baum et al. |
| 2014/0223084 A1 | 8/2014 | Lee et al. |
| 2014/0258755 A1 | 9/2014 | Stenfort |
| 2014/0269090 A1 | 9/2014 | Flynn et al. |
| 2014/0310494 A1 | 10/2014 | Higgins et al. |
| 2014/0359381 A1 | 12/2014 | Takeuchi et al. |
| 2015/0023097 A1 | 1/2015 | Khoueir et al. |
| 2015/0037624 A1 | 2/2015 | Thompson et al. |
| 2015/0153799 A1 | 6/2015 | Lucas et al. |

(56) References Cited

U.S. PATENT DOCUMENTS

| | | | |
|---|---|---|---|
| 2015/0153802 A1 | 6/2015 | Lucas et al. | |
| 2015/0212943 A1 | 7/2015 | Yang et al. | |

FOREIGN PATENT DOCUMENTS

| | | |
|---|---|---|
| EP | 1 990 921 A2 | 11/2008 |
| EP | 2 386 958 A1 | 11/2011 |
| EP | 2 620 946 A2 | 7/2013 |
| JP | 2002-532806 S | 10/2002 |
| WO | WO 2007/036834 A2 | 4/2007 |
| WO | WO 2007/080586 A2 | 7/2007 |
| WO | WO 2008/075292 A2 | 6/2008 |
| WO | WO 2008/121553 | 10/2008 |
| WO | WO 2008/121577 | 10/2008 |
| WO | WO 2009/028281 A1 | 3/2009 |
| WO | WO 2009/032945 A1 | 3/2009 |
| WO | WO 2009/058140 A1 | 5/2009 |
| WO | WO 2009/084724 | 7/2009 |
| WO | WO 2009/134576 A1 | 11/2009 |
| WO | WO 2011/024015 | 3/2011 |

OTHER PUBLICATIONS

Kang, A Multi-Channel Architecture for High-Performance NAND Flash-Based Storage System, J. Syst. Archit., 53, 9, Sep. 2007, 15 pgs.
Kim, A Space-Efficient Flash Translation Layer for CompactFlash Systems, May 2002, 10 pgs.
McLean, Information Technology—AT Attachment with Packet Interface Extension, Aug. 19, 1998, 339 pgs.
Park, A High Performance Controller for NAND Flash-Based Solid State Disk (NSSD), Feb. 12-16, 2006, 4 pgs.
Pliant Technology, International Search Report / Written Opinion, PCT/US08/88133, Mar. 19, 2009, 7 pgs.
Pliant Technology, International Search Report / Written Opinion, PCT/US08/88136, Mar. 19, 2009, 7 pgs.
Pliant Technology, International Search Report / Written Opinion, PCT/US08/88146, Feb. 26, 2009, 10 pgs.
Pliant Technology, International Search Report / Written Opinion, PCT/US08/88154, Feb. 27, 2009, 9 pgs.
Pliant Technology, Written Opinion, PCT/US08/88164, Feb. 13, 2009, 6 pgs.
Pliant Technology, International Search Report / Written Opinion, PCT/US08/88206, Feb. 18, 2009, 8 pgs.
Pliant Technology, International Search Report / Written Opinion, PCT/US08/88217, Feb. 19, 2009, 7 pgs.
Pliant Technology, International Search Report / Written Opinion, PCT/US08/88229, Feb. 13, 2009, 8 pgs.
Pliant Technology, International Search Report / Written Opinion, PCT/US08/88232, Feb. 19, 2009, 8 pgs.
Pliant Technology, International Search Report / Written Opinion, PCT/US08/88236, Feb. 19, 2009, 7 pgs.
Pliant Technology, International Search Report / Written Opinion, PCT/US2011/028637, Oct. 27, 2011, 11 pgs.
Pliant Technology, Supplementary ESR, 08866997.3, Feb. 23, 2012, 6 pgs.
SanDisk Enterprise IP LLC, International Search Report / Written Opinion, PCT/US2012/042771, Mar. 4, 2013, 14 pgs.
SanDisk Enterprise IP LLC, International Search Report / Written Opinion, PCT/US2012/065916, Apr. 5, 2013, 7 pgs.
SanDisk Enterprise IP LLC, International Search Report / Written Opinion, PCT/US2012/042764, Aug. 31, 2012, 12 pgs.
SanDisk Enterprise IP LLC, International Search Report / Written Opinion, PCT/US2012/042775, Sep. 26, 2012, 9 pgs.
SanDisk Enterprise IP LLC, International Search Report / Written Opinion, PCT/US2012/059459, Feb. 14, 2013, 9 pgs.
SanDisk Enterprise IP LLC, Office Action, CN 200880127623.8, Apr. 18, 2012, 12 pgs.
SanDisk Enterprise IP LLC, Office Action, CN 200880127623.8, Dec. 31, 2012, 9 pgs.
SanDisk Enterprise IP LLC, Office Action, JP 2010-540863, Jul. 24, 2012, 3 pgs.
Watchdog Timer and Power Savin Modes, Microchip Technology Inc., 2005.
Zeidman, 1999 Verilog Designer's Library (04US), 9 pgs.
SanDisk Enterprise IP LLC, International Search Report / Written Opinion, PCT/US2012/059447, Jun. 6, 2013, 12 pgs.
SanDisk Enterprise IP LLC, International Search Report / Written Opinion, PCT/US2012/059453, Jun. 6, 2013, 12 pgs.
SanDisk Enterprise IP LLC, International Search Report / Written Opinion, PCT/US2012/065914, May 23, 2013, 7 pgs.
SanDisk Enterprise IP LLC, International Search Report / Written Opinion, PCT/US2012/065919, Jun. 17, 2013, 8 pgs.
SanDisk Enterprise IP LLC, Notification of the Decision to Grant a Patent Right for Patent for Invention, CN 200880127623.8, Jul. 4, 2013, 1 pg.
Canim, Buffered Bloom ilters on Solid State Storage, ADMS*10, Singapore, Sep. 13-17, 2010, 8 pgs.
Lu, A Forest-structured Bloom Filter with Flash Memory, MSST 2011, Denver, CO, May 23-27, 2011, article, 6 pgs.
Lu, A Forest-structured Bloom Filter with Flash Memory, MSST 2011, Denver, CO, May 23-27, 2011, presentation slides, 25 pgs.
International Search Report and Written Opinion dated Mar. 7, 2014, received in International Patent Application No. PCT/US2013/074772, which corresponds to U.S. Appl. No. 13/831,218, 10 pages (George).
International Search Report and Written Opinion dated Mar. 24, 2014, received in International Patent Application No. PCT/US2013/074777, which corresponds to U.S. Appl. No. 13/831,308, 10 pages (George).
International Search Report and Written Opinion dated Mar. 7, 2014, received in International Patent Application No. PCT/US2013/074779, which corresponds to U.S. Appl. No. 13/831,374, 8 pages (George).
International Search Report and Written Opinion dated Jul. 25, 2014, received in International Patent Application No. PCT/US2014/029453, which corresponds to U.S. Appl. No. 13/963,444, 9 pages (Frayer).
Ashkenazi et al., "Platform independent overall security architecture in multi-processor system-on-chip integrated circuits for use in mobile phones and handheld devices," ScienceDirect, Computers and Electrical Engineering 33 (2007), 18 pages.
Invitation to Pay Additional Fees dated Feb. 13, 2015, received in International Patent Application No. PCT/US2014/063949, which corresponds to U.S. Appl. No. 14/135,433, 6 pages (Delpapa).
International Search Report and Written Opinion dated Mar. 9, 2015, received in International Patent Application No. PCT/US2014/059747, which corresponds to U.S. Appl. No. 14/137,440, 9 pages (Fitzpatrick).
International Search Report and Written Opinion dated Jan. 21, 2015, received in International Application No. PCT/US2014/059748, which corresponds to U.S. Appl. No. 14/137,511, 13 pages (Dancho).
Internationai Search Report and Written Opinion dated Feb. 18, 2015, received in Internanonal Application No. PCT/US2014/066921, which corresponds to U.S. Appl. No. 14/135,260, 13 pages (Fitzpatrick).
International Search Report and Written Opinion dated Jul. 23, 2015, received in International Patent Application No. PCT/US2015/030850, which corresponds to U.S. Appl. No. 14/298,843, 12 pages (Ellis).
Bayer, "Prefix B-Trees", IP.COM Journal, IP.COM Inc., West Henrietta, NY, Mar. 30, 2007, 29 pages.
Bhattacharjee et al., "Efficient Index Compression in DB2 LUW", IBM Research Report, Jun. 23, 2009, http://domino.research.ibm.com/library/cyberdig.nsf/papers/40B2C45876D0D747852575E100620CE7/$File/rc24815.pdf, 13 pages.
Oracle, "Oracle9i: Database Concepts", Jul. 2001, http://docs.oracle.com/cd/A91202_01/901_doc/server.901/a88856.pdf, 49 pages.

(56) References Cited

OTHER PUBLICATIONS

International Search Report and Written Opinion dated Jun. 8, 2015, received in International Patent Application No. PCT/US2015/018252, which corresponds to U.S. Appl. No. 14/339,072, 9 pages (Busch).

International Search Report and Written Opinion dated Jun. 2, 2015, received in International Patent Application No. PCT/US2015/018255, which corresponds to U.S. Appl. No. 14/336,967, 14 pages (Chander).

International Search Report and Written Opinion dated Jun. 30, 2015, received in International Patent Application No. PCT/US2015/023927, which corresponds to U.S. Appl. No. 14/454,687, 11 pages (Kadayam).

Lee et al., "A Semi-Preemptive Garbage Colector for Solid State Drives," Apr. 2011, IEEE, pp. 12-21.

Office Action dated Feb. 17, 2015, received in Chinese Patent Application No. 201210334987.1, which corresponds to U.S. Appl. No. 12/082,207, 9 pages (Prins).

International Search Report and Written Opinion dated May 4, 2015, received in International Patent Application No. PCT/US2014/065987, which corresponds to U.S. Appl. No. 14/135,400, 12 pages (George).

International Search Report and Written Opinion dated Mar. 17, 2016, received in International Patent Application No. PCT/US2014/057467, which corresponds to U.S. Appl. No. 14/135,420, 13 pages (Lucas).

International Search Report and Written Opinion dated Apr. 20, 2015, received in International Patent Application No. PCT/US2014/063949, which corresponds to U.S. Appl. No. 14/135,433, 21 pages (Delpapa).

Gasior, "Gigabyte's i-Ram storage device, Ram disk without the fuss," The Tech Report, p. 1, Jan. 25, 2006, 5 pages.

Office Action dated Dec. 8, 2014, received in Chinese Patent Application No. 201180021660.2, which corresponds to U.S. Appl. No. 12/726,200, 7 pages (Olbrich).

Office Action dated Jul. 31, 2015, received in Chinese Patent Application No. 201180021660.2, which corresponds to U.S. Appl. No. 12/726,200, 9 pages (Olbrich).

IBM Research-Zurich, "The Fundamental Limit of Flash Random Write Performance: Understanding, Analysis and Performance Modeling," Mar. 31, 2010, pp. 1-15.

International Search Report and Written Opinion dated Sep. 14, 2015, received in International Patent Application No. PCT/US2015/036807, which corresponds to U.S. Appl. No. 14/311,152, 9 pages (Higgins).

Oestreicher et al., "Object Lifetimes in Java Card," 1999, USENIX, 10 pages.

International Preliminary Report on Patentability dated May 24, 2016, received in International Patent Application No. PCT/US2014/065987, which corresponds to U.S. Appl. No. 14/135,400, 9 pages (George).

\* cited by examiner

US 9,454,420 B1

METHOD AND SYSTEM OF READING THRESHOLD VOLTAGE EQUALIZATION

RELATED APPLICATIONS

This application claims priority to U.S. Provisional Patent Application No. 61/747,760, filed Dec. 31, 2012, which is hereby incorporated by reference in its entirety.

TECHNICAL FIELD

This disclosure relates generally to memory systems, and in particular, to improving the reliability of memory systems.

BACKGROUND

Semiconductor memory devices, including flash memory devices, typically utilize memory cells to store data as an electrical value, such as an electrical charge or a voltage. A flash memory cell, for example, includes a single transistor with a floating gate that is used to store a charge representative of one or more data values. Increases in storage density have been facilitated in various ways, including increasing the density of memory cells, enabled by reductions in the minimum feature sizes of the semiconductor manufacturing processes used to manufacture flash memory devices, and transitioning from single-level flash memory cells to multi-level flash memory cells, so that two or more bits can be stored by each flash memory cell.

A drawback of increasing storage density is that the stored data is more prone to being stored and/or read erroneously. An error control coding (ECC) engine is utilized to limit the number of uncorrectable errors that are introduced by pseudo-random fluctuations, defects in the storage medium, operating conditions, device history, and/or write-read circuitry, etc.

SUMMARY

The embodiments described herein provide a system and method to minimize the burden on the ECC engine of a persistent storage device or persistent storage controller by adjusting one or more reading threshold voltages so as to provide for more reliable reads from and writes to a persistent storage medium.

Various implementations of systems, methods and devices within the scope of the appended claims each have several aspects, no single one of which is solely responsible for the attributes described herein. Without limiting the scope of the appended claims, after considering this disclosure, and particularly after considering the section entitled "Detailed Description" one will understand how the aspects of various implementations are used to enable a system for adjusting a reading threshold voltage of a flash memory cell which in turn uses less power and/or less memory. In one aspect, the system utilizes error correction information (e.g., a number of errors in a respective codeword of raw read data, a bit error rate for a distinct portion of a storage medium, a current number of decoding iterations, etc.) generated by the ECC engine during normal read operations to determine whether to adjust at least a first reading threshold voltage. Adjustments are made to the first reading threshold voltage, if determined to be needed by analysis of the error correction information, while continuing to process persistent storage access commands (e.g., read, write and erase commands). Further, in some implementations, the system initiates recalibration of the first reading threshold voltage when a predefined event occurs (e.g., the error correction information indicates that the system is unable to decode read data corresponding to one or more read commands).

BRIEF DESCRIPTION OF THE DRAWINGS

So that the present disclosure can be understood in greater detail, a more particular description may be had by reference to the aspects of various implementations, some of which are illustrated in the appended drawings. The appended drawings, however, merely illustrate the more pertinent aspects of the present disclosure and are therefore not to be considered limiting, for the description may admit to other effective aspects.

Figure 1A:
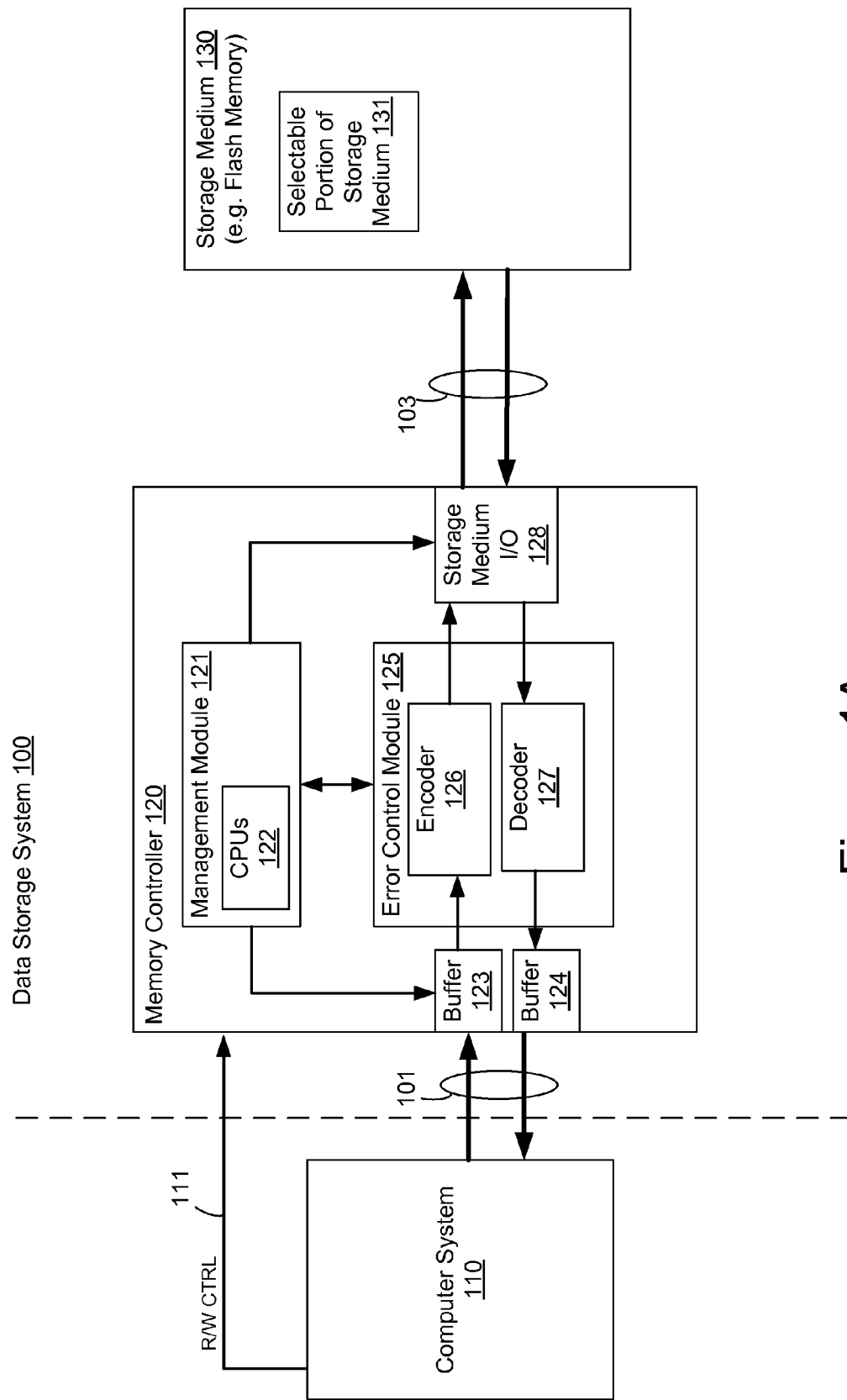
FIG. 1A is a diagram of a data storage system, in accordance with some embodiments.

In accordance with common practice the various features illustrated in the drawings may not be drawn to scale. So the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The various implementations described herein include systems, methods and/or devices used to improve the reliability of a storage medium, such as a flash memory device. Some implementations utilize error correction information to determine whether to adjust at least a first reading threshold voltage according to a reading threshold voltage refinement process, sometimes herein called a decision feedback equalization (DFE) process, and adjust the value of the first reading threshold voltage based on the error correction information.

More specifically, some implementations include a method of reading data from a set of flash memory cells in a flash memory array in response to one or more host read commands and in accordance with the one or more host read commands and at least a first reading threshold voltage of one or more reading threshold voltages. The method includes performing an error correction process, in response to the one or more host read commands, on the read data to produce error correction information. The method further includes determining, based on the error correction information, whether to adjust at least the first reading threshold voltage, and upon determining to adjust the first reading threshold voltage, setting the value of the first reading threshold voltage to a value greater or less than a current value of the first reading threshold voltage.

In some embodiments, the read data comprises data values, including a number, y, of data values in the read data corrected by the error correction process from first predefined data values to second predefined data values and a number, x, of values in the read data corrected by the error correction process from the second predefined data values to the first predefined data values, and setting the value of the first reading threshold voltage includes shifting the value of the first reading threshold voltage in a direction associated with decreasing y when y>x.

In some embodiments, setting the value of the first reading threshold voltage includes shifting the value of the first reading threshold voltage in a direction associated with decreasing x when x>y.

In some embodiments, the method further comprises: determining, based on the error correction information, whether to adjust a set of reading threshold voltages distinct from the first reading threshold voltage; and upon determining to adjust the set of reading threshold voltages, setting the values of the set of reading threshold voltages to values greater or less than corresponding current values of the set of reading threshold voltages.

In some embodiments, determining whether to adjust the reading threshold voltage includes determining whether a number of errors indicated by the error correction information exceeds a first predefined threshold.

In some embodiments, the method further comprises storing, in a controller memory of the flash memory controller, a plurality of reading threshold voltages for a corresponding plurality of distinct portions of the flash memory array, where the plurality of reading threshold voltages include the first reading threshold voltage.

In some embodiments, setting the value of the first reading threshold voltage to a value greater or less than a current value of the first reading threshold value includes generating an adjusted first reading threshold voltage and storing the adjusted first reading threshold voltage in the controller memory.

In some embodiments, the method further comprises initiating a recalibration of the first reading threshold voltage when a predefined condition occurs.

In some embodiments, the predefined condition occurs when the error correction information indicates at least one of: the controller is unable to decode the read data; the controller performed a predefined threshold number of correction cycles while performing the error correction process on the read data; and the number of errors exceeds a predefined error threshold.

In some embodiments, the predefined condition is selected from: the error correction process cannot correct data determined to be in error; the flash memory device regains power after a loss of power; or the flash memory device has not performed any operations for a predetermined amount of time.

Numerous details are described herein in order to provide a thorough understanding of the example implementations illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as not to unnecessarily obscure more pertinent aspects of the implementations described herein.

FIG. 1 is a diagram of an implementation of a data storage system 100. While some example features are illustrated, those skilled in the art will appreciate from the present disclosure that various other features have not been illustrated for the sake of brevity and so as not to obscure more pertinent aspects of the example implementations disclosed herein. To that end, as a non-limiting example, the data storage system 100 includes a memory controller 120, and a storage medium 130, and is used in conjunction with a computer system 110. In some implementations, storage medium 130 is a single flash memory device while in other implementations storage medium 130 includes a plurality of flash memory devices. In some implementations, storage medium 130 comprises at least one of NAND-type flash memory and NOR-type flash memory. Further, in some implementations memory controller 120 is a solid-state drive (SSD) controller. However, those skilled in the art will appreciate that various other types of storage media may be included in accordance with aspects of a wide variety of implementations.

Computer system 110 is coupled to memory controller 120 through data connections 101. Moreover, those skilled in the art will appreciate from the present disclosure that in various implementations computer system 110 includes memory controller 120 as a component and/or a sub-system. Computer system 110 may be any suitable computer device, such as a computer, a laptop computer, a tablet device, a netbook, an internet kiosk, a personal digital assistant, a mobile phone, a smart phone, a gaming device, a computer server, or any other computing device. Computer system 110 is sometimes called a host or host system. In some implementations, computer system 110 includes one or more processors, one or more types of memory, a display and/or other user interface components such as a keyboard, a touch screen display, a mouse, a track-pad, a digital camera and/or any number of supplemental devices to add functionality.

Storage medium 130 is coupled to memory controller 120 through connections 103. Connections 103 are sometimes called data connections, but typically convey commands in addition to data, and optionally convey metadata, error correction information and/or other information in addition to data values to be stored in storage medium 130 and data values read from storage medium 130. Moreover, those skilled in the art will appreciate from the present disclosure that in various implementations memory controller 120 and storage medium 130 are included in the same device as components thereof. Storage medium 130 may include any number (i.e., one or more) of memory devices including, without limitation, non-volatile semiconductor memory devices, such as flash memory. For example, flash memory devices can be configured for enterprise storage suitable for applications such as cloud computing, or for caching data stored (or to be stored) in secondary storage, such as hard disk drivers. Additionally and/or alternatively, flash memory can also be configured for relatively smaller-scale applications such as personal flash drives or hard-disk replacements for personal, laptop and tablet computers.

Storage medium 130 is divided into a number of addressable and individually selectable blocks, such as selectable portion 131. In some implementations the individually selectable blocks are the minimum size erasable units in a flash memory device. In other words, each block contains the minimum number of memory cells that can be erased simultaneously. Each block is usually further divided into a plurality of pages and/or word lines, where each page or word line is typically an instance of the smallest individually accessible (readable) portion in a block. In some implementations (e.g., using some types of flash memory), the smallest individually accessible unit of a data set, however, is a sector, which is a subunit of a page. That is, a block includes a plurality of pages, each page contains a plurality of sectors, and each sector is the minimum unit of data for reading data from the flash memory device.

For example, one block comprises any number of pages, for example, 64 pages, 128 pages, 256 pages or another suitable number of pages. Blocks are typically grouped into a plurality of zones. Each block zone can be independently managed to some extent, which increases the degree of parallelism for parallel operations and simplifies management of storage medium 130.

As noted above, while data storage densities of non-volatile semiconductor memory devices are generally increasing, a drawback of increasing storage density is that the stored data is more prone to being stored and/or read erroneously. As described in greater detail below, error control coding can be utilized to limit the number of uncorrectable errors that are introduced by pseudo-random fluctuations, defects in the storage medium, operating conditions, device history, write-read circuitry, etc., or a combination of these and various other factors.

In some implementations, memory controller 120 includes a management module 121, an input buffer 123, an output buffer 124, an error control module 125 and a storage medium interface (I/O) 128. Those skilled in the art will appreciate from the present disclosure that memory controller 120 may include various additional features that have not been illustrated for the sake of brevity and so as not to obscure more pertinent features of the example implementations disclosed herein, and that a different arrangement of features may be possible. Input and output buffers 123,124 provide an interface to computer system 110 through data connections 101. Similarly, storage medium I/O 128 provides an interface to storage medium 130 though connections 103. In some implementations, storage medium I/O 128 includes read and write circuitry, including circuitry capable of providing reading signals to storage medium 130 (e.g., reading threshold voltages for NAND-type flash memory).

In some implementations, management module 121 includes one or more processing units (CPUs, also sometimes called processors) 122 configured to execute instructions in one or more programs, e.g., in management module 121. However, those skilled in the art will appreciate from the present disclosure that one or more CPUs 122 may be shared by one or more components within, and in some cases, beyond the function of memory controller 120. Management module 121 is coupled to input buffer 123, output buffer 124 (connection not shown), error control module 125 and storage medium I/O 128 in order to coordinate the operation of these components.

Error control module 125 is coupled to storage medium I/O 128, input buffer 123 and output buffer 124. Error control module 125 is provided to limit the number of uncorrectable errors inadvertently introduced into data. In some embodiments, error control module 125 is executed in software by the one or more CPUs 122 of management module 121, and in other embodiments is implemented in whole or in part using special purpose circuitry to perform encoding and decoding functions. To that end, error control module 125 includes an encoder 126 and a decoder 127. Encoder 126 encodes data by applying an error control code to produce a codeword, which is subsequently stored in storage medium 130. When the encoded data (e.g., one or more codewords) is read from storage medium 130, decoder 127 applies a decoding process to the encoded data to recover the data, and to correct errors in the recovered data within the error correcting capability of the error control code. Those skilled in the art will appreciate from the present disclosure that various error control codes have different error detection and correction capacities, and that particular codes are selected for various applications for reasons beyond the scope of this disclosure. As such, an exhaustive review of the various types of error control codes is not provided herein. Moreover, those skilled in the art will appreciate that each type or family of error control codes may have encoding and decoding algorithms that are particular to the type or family of error control codes. On the other hand some algorithms, such as the Viterbi algorithm, may be utilized at least to some extent in the decoding of a number of different types or families of error control codes. As such, for the sake of brevity, an exhaustive description of the various types of encoding and decoding algorithms generally available and known to those skilled in the art is not provided herein.

During a write operation, input buffer 123 receives data to be stored in storage medium 130 from computer system 110. The data held in input buffer 123 is made available to encoder 126, which encodes the data to produce one or more codewords. The one or more codewords are made available to storage medium I/O 128, which transfers the one or more codewords to storage medium 130 in a manner dependent on the type of storage medium being utilized.

A read operation is initiated when computer system (host) 110 sends one or more host read commands on control line 111 to memory controller 120 requesting data from storage medium 130. Memory controller 120 sends one or more read access commands to storage medium 130, via storage medium I/O 128, to obtain raw read data in accordance with memory locations (addresses) specified by the one or more host read commands. Storage medium I/O 128 provides the raw read data (e.g., comprising one or more codewords) to decoder 127. If the decoding is successful, the decoded data is provided to output buffer 124, where the decoded data is made available to computer system 110. In some implementations, if the decoding is not successful, memory controller 120 may resort to a number of remedial actions or provide an indication of an irresolvable error condition. For example, as will be further described below, in some embodiments a recalibration (FFE) process is initiated if the decoding is unsuccessful.

Figure 1B:
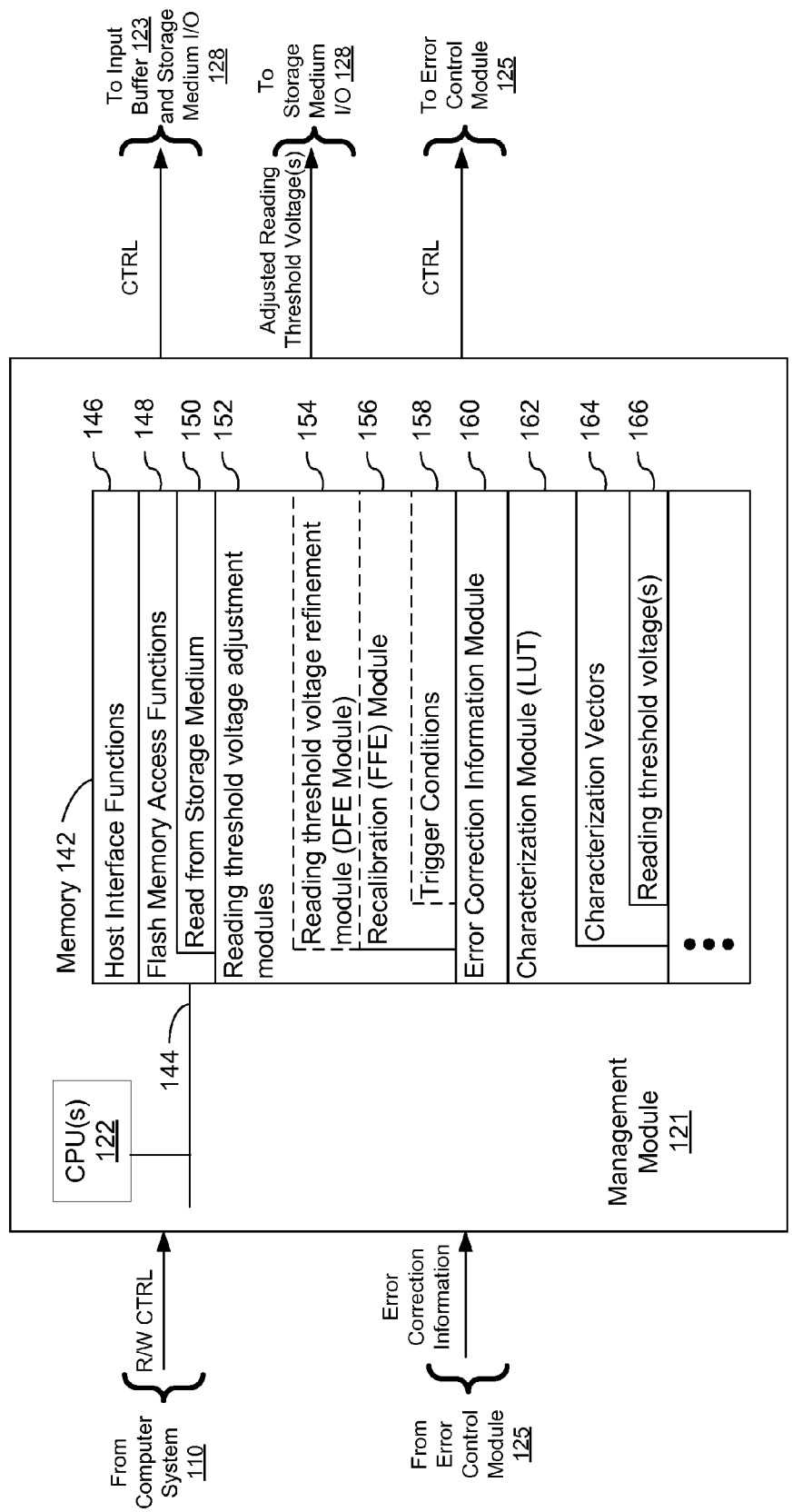
FIG. 1B is a diagram of a management module, in accordance with some embodiments.

FIG. 1B is a block diagram illustrating management module 121 in greater detail, in accordance with some embodiments. Elements common to FIGS. 1A-1B include common reference numbers, and only the differences between FIGS. 1A and 1B are described herein for the sake of brevity. Moreover, while certain specific features are illustrated, those skilled in the art will appreciate from the present disclosure that various other features have not been illustrated for the sake of brevity and so as not to obscure more pertinent aspects of the example implementations disclosed herein.

To that end, as a non-limiting example, memory management module 121 includes one or more processing units (CPUs) 122, memory 142 and one or more communication buses 144 for interconnecting these components. In some embodiments, communication buses 144 include circuitry (sometimes called a chipset) that interconnects and controls communications between system components (e.g., communications between management module 121 and error control module 125). Memory 142 includes high-speed random access memory, such as DRAM, SRAM, DDR RAM or other random access solid state memory devices; and optionally includes non-volatile memory, such as one or more magnetic disk storage devices, optical disk storage devices, flash memory devices, or other non-volatile solid state storage devices. Memory 142, or alternately the non-volatile memory device(s) within memory 142, includes a non-transitory computer readable storage medium. In some embodiments, memory 142 or the non-transitory computer readable storage medium of memory 142 stores the following programs, modules and data structures, or a subset thereof:

- host interface functions 146 include procedures for handling commands sent from computer system 110;
- flash memory access functions 148 for issuing storage medium access commands, including function 150 to read data from storage medium 130;
- reading threshold voltage adjustment modules 152 for adjusting one or more reading threshold voltages, including reading threshold voltage refinement module 154 and recalibration (FFE) module 156, where recalibration module 156 includes one or more trigger conditions 158;
- error correction information module 160 for storing error correction information received from error control module 125; and
- characterization module (e.g., a look-up table (LUT)) 162 includes characterization vectors 164 for corresponding portions of storage medium 130, where characterization vectors 164 include one or more reading threshold voltages 166.

Each of the aforementioned management module functions, such as host interface functions 146, flash memory access functions and reading threshold voltage adjustment modules 152, is configured for execution by the one or more CPUs 122 of management module 121, so as to perform the associated function or task with respect to storage medium 130.

Error correction information from error control module 125, which performs an error correction process on raw read data (e.g., error correction based on BCH or LDPC error correction codes in the raw data), is stored in error correction information module 160. For example, the error correction information includes a number of errors in a respective codeword of the raw read data, a bit error rate for a respective portion of a storage medium from which the raw read data was read, a current number of decoding iterations, and so on. Reading threshold voltage adjustment module 152 utilizes error correction information stored in error correction information module 160 to determine whether to invoke reading threshold voltage refinement module 154, sometimes called DFE (decision feedback equalization) module 154, or reading threshold voltage recalibration module 156, sometimes herein called feed forward equalization—FFE module 156. Reading threshold voltage refinement module 154 adjusts one or more reading threshold voltages for a corresponding portion of storage medium 130. If at least one or the trigger conditions 158 occur, FFE module 156 recalibrates one or more reading threshold voltages for a corresponding portion of storage medium 130. In some embodiments, if neither reading threshold voltage refinement module 154 nor FFE module 156 are invoked (e.g., when the error correction information indicates that the number of errors in the raw read data is less than a predefined threshold), the one or more reading threshold voltages for the corresponding portion of storage medium 130 from which the raw read data was read remain unchanged.

Characterization module (LUT) 162 stores characterization vectors 164, and each characterization vector includes one or more reading threshold voltages 166 corresponding to portions of storage medium 130. Each characterization vector 164 is associated with a distinct die, block zone, block, word line, word line zone or page portion of storage medium 130. For example, without limitation, in some embodiments in which storage medium 130 includes multiple die, characterization module 162 includes at least one characterization vector for each distinct die. In another example, in some embodiments, characterization module 162 includes a set of distinct characterization vectors 164 for each die in storage medium 130, and the set of distinct characterization vectors 164 for each die includes at one distinct characterization vector for each block, or each block zone of a plurality of block zones, in the die. In some implementations, at least a plurality of the reading threshold voltages 166 in the characterization vectors 164 are adjusted reading threshold voltages, produced by reading threshold voltage refinement module 154, or are recalibrated reading threshold voltages produced by FFE module 156.

Each characterization vector 164 corresponds to a different set storage medium characterization parameter values. More specifically, in some implementations, the one or more storage medium characterization parameter values provide an indication of at least one of: a physical characteristic of at least a portion of the storage medium (e.g., the portion of the storage medium associated with the characterization vector 164), a mode of operation associated with the portion of at least a portion of the storage medium, a history of use associated with at least a portion of the storage medium, a condition characteristic associated with at least a portion of the storage medium, a read type associated with at least a portion of the storage medium, and a location associated with at least a portion of the storage medium. In some implementations, the one or more storage medium characterization parameter values includes an indicator of the number of previous program/erase cycles of the storage medium (or, alternatively, an indicator of the number of previous program/erase cycles of at least a portion of the storage medium). Furthermore, in some implementations, the one or more storage medium characterization parameter values includes an indicator of the current temperature of the storage medium 130.

Flash memory devices utilize memory cells to store data as electrical values, such as electrical charges or voltages. Each flash memory cell typically includes a single transistor with a floating gate that is used to store a charge, which modifies the threshold voltage of the transistor (i.e., the voltage needed to turn the transistor on). The magnitude of the charge, and the corresponding threshold voltage the charge creates, is used to represent one or more data values. In some implementations, during a read operation, a reading threshold voltage is applied to the control gate of the transistor and the resulting sensed current or voltage is mapped to a data value.

The terms "cell voltage" and "memory cell voltage," in the context of flash memory cells, means the threshold voltage of the memory cell, which is the minimum voltage that needs to be applied to the gate of the memory cell's transistor in order for the transistor to conduct current. Similarly, reading threshold voltages (sometimes also called reading signals and reading voltages) applied to a flash memory cells are gate voltages applied to the gates of the flash memory cells to determine whether the memory cells conduct current at that gate voltage. In some implementations, when a flash memory cell's transistor conducts current at a given reading threshold voltage, indicating that the cell voltage is less than the reading threshold voltage, the raw data value for that read operation is a "1" and otherwise it is a "0."

As discussed below with reference to FIGS. 2A-2B, a single-level flash memory cell (SLC) stores one bit of information ("0" or "1"). Thus, the storage density of an SLC memory device is one bit per memory cell. A multi-level flash memory cell (MLC), however, can store two or more bits of information by using different ranges within the total voltage range of the memory cell to represent a multi-bit bit-tuple. In turn, the storage density of an MLC memory device is multiple-bits per cell (e.g., two bits per memory cell).

Figure 2A:
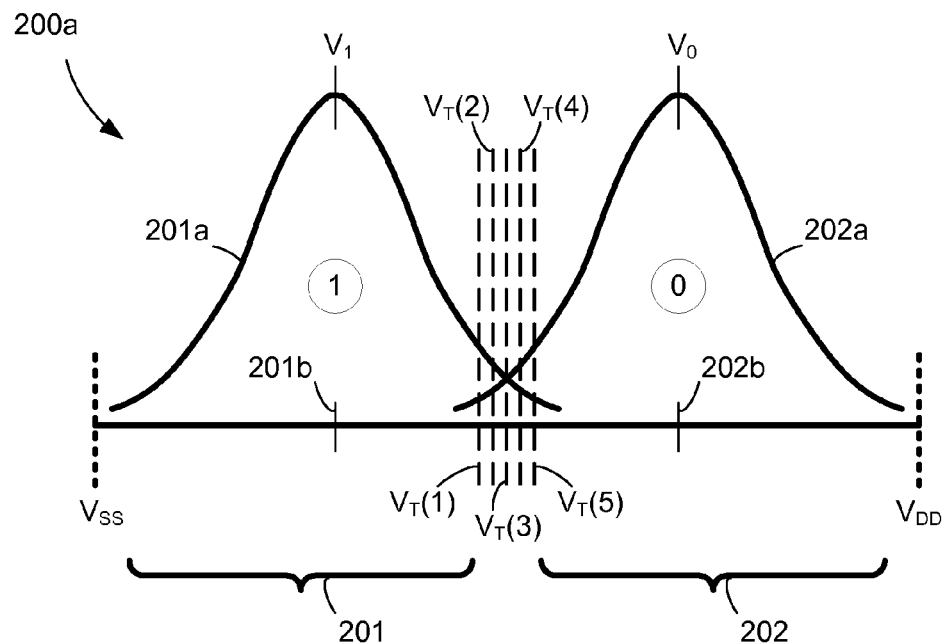
FIG. 2A is a prophetic diagram of voltage distributions that may be found in a single-level flash memory cell (SLC) over time and reading threshold voltages that are applied to the SLC according to a reading threshold voltage refinement process, sometimes herein called a decision feedback equalization (DFE) process, in accordance with some embodiments.

FIG. 2A is a simplified, prophetic diagram of voltage distributions 200a found in a single-level flash memory cell (SLC) over time and reading threshold voltages $V_T(1)$, $V_T(2)$, $V_T(3)$, $V_T(4)$, $V_T(5)$ that are applied to the SLC according to a reading threshold voltage refinement process (sometimes called a decision feedback equalization (DFE) process). Those skilled in the art will appreciate from the present disclosure that the voltage distributions 200a have been simplified for illustrative purposes. In this example, the SLC's voltage range extends approximately from a voltage, $V_{SS}$, at a source terminal of an NMOS transistor to a voltage, $V_{DD}$, at a drain terminal of the NMOS transistor. As such, voltage distributions 200a extend between $V_{SS}$ and $V_{DD}$.

Sequential voltage ranges 201 and 202 between the source voltage $V_{SS}$ and drain voltage $V_{DD}$ are used to represent corresponding bit values "1" and "0," respectively. Each voltage range 201 and 202 has a respective center voltage $V_1$ 201b and $V_0$ 202b. As described above, in many circumstances the memory cell current sensed in response to an applied reading threshold voltages is indicative of a memory cell voltage different from the respective center voltage $V_1$ 201b or $V_0$ 202b corresponding to the respective bit value written into the memory cell. Errors in cell voltage, and/or the cell voltage sensed when reading the memory cell, can occur during write operations, read operations, or due to "drift" of the cell voltage between the time data is written to the memory cell and the time a read operation is performed to read the data stored in the memory cell. For ease of discussion, these effects are collectively described as "cell voltage drift." Each voltage range 201 and 202 also has a respective distribution of voltages 201a and 202a that may occur as a result of any number of a combination of error-inducing factors, examples of which are identified above.

In some implementations, reading threshold voltages $V_T(1)$, $V_T(2)$, $V_T(3)$, $V_T(4)$, $V_T(5)$ are applied between adjacent center voltages, e.g., applied proximate to the halfway region between adjacent center voltages $V_1$ 201b, and $V_0$ 202b. Optionally, in some implementations, some or all of the reading threshold voltages are located between voltage ranges 201, 202. In some implementations, reading threshold voltages $V_T(1)$, $V_T(2)$, $V_T(3)$, $V_T(4)$, $V_T(5)$ are applied in the region proximate to where the voltage distributions 201a, 202a overlap, which is not necessarily proximate to the halfway region between adjacent center voltages $V_1$ 201b, and $V_0$ 202b.

In some embodiments, a reading threshold voltage refinement process is enabled to adjust a first reading threshold voltage located in the transition or overlap between adjacent voltage ranges of the SLC shown in FIG. 2A (e.g., between voltage ranges 201 and 202). First, data is read from a set of flash memory cells in accordance with one or more host read commands and a current value of the first reading threshold voltage (e.g., $V_T(3)$), which is a parameter value of a characterization vector associated with the flash memory cells). Second, an ECC engine performs an error correction process on the read data to produce error correction information. Third, the controller determines whether to adjust the current value of the first reading threshold voltage (e.g., $V_T(3)$). In some embodiments, the controller adjusts the value of the first reading threshold voltage if a number of errors indicated by the error correction information exceeds a predefined threshold. Fourth, the first reading threshold voltage is adjusted by setting the value of the first reading threshold voltage to a value greater (e.g., $V_T(4)$) or less than (e.g., $V_T(2)$) a current value of the first reading threshold voltage (e.g., $V_T(3)$).

In some embodiments, the controller determines whether to set the value of the first reading threshold voltage to a value greater or less than a current value of the first reading threshold voltage based on the read data (sometimes called hard decision bits or raw data) that comprises bits, including a number, y, of "1" bits determined by the error correction process to be in error (where "1" is the corrected data value after application of the error correction process, and y is the number of 1 bits mistakenly read as "0" bits) and a number, x, of "0" bits determined by the error correction process to be in error (where "0" is the corrected data value after application of the error correction process, and x is the number of 0 bits mistakenly read as "1" bits). In some embodiments, the controller sets the value of the first reading threshold voltage by shifting the value of the first reading threshold voltage in a direction associated with decreasing y (e.g., towards $V_{DD}$) when y>x (e.g., when the error correction process indicates that the number of "1" bits read in error is greater than the number of "0" bits read in error). For example, the controller shifts the value of the first reading threshold voltage from the current value of the first reading threshold voltage (e.g., $V_T(3)$) towards $V_{DD}$ (e.g., to $V_T(4)$ or $V_T(5)$) to compensate for more "1" bits read in error.

In some implementations example, the magnitude of the shift of the first reading threshold voltage is based on how much greater y (e.g., the number of "1" bits read in error) is than x (e.g., the number of "0" bits read in error). To that end, for example, if 4x>y≥x the value of the first reading threshold voltage is shifted to $V_T(4)$, but if y≥4x the value of the first reading threshold voltage is shifted to $V_T(5)$.

In some embodiments, the controller sets the value of the first reading threshold voltage by shifting the value of the first reading threshold voltage in a direction associated with decreasing x (e.g., towards $V_{SS}$) when x>y (e.g., when the error correction process indicates that the number of "0" bits read in error is greater than the number of "1" bits read in error). For example, the controller shifts the first reading threshold voltage from the current value of the first reading threshold voltage (e.g., $V_T(3)$) shifts towards $V_{SS}$ (e.g., to $V_T(2)$ or $V_T(1)$).

In some implementations, the magnitude of the shift of the first reading threshold voltage is based on how much greater x (e.g., the number of "0" bits read in error) is than y (e.g., the number of "1" bits read in error). To that end, for example, if $4y>x\geq y$ the value of the first reading threshold voltage is shifted to $V_T(2)$, but if $x\geq 4y$ the value of the first reading threshold voltage is shifted to $V_T(1)$. In some other implementations, the magnitude of the shift of the first reading threshold voltage is independent of how much greater x (e.g., the number of "0" bits read in error) is than y (e.g., the number of "1" bits read in error).

In some implementations, when the reading threshold voltage refinement process adjusts the first reading threshold voltage, the magnitude of the adjustment (or step) of the first reading threshold voltage value can be any appropriate voltage, depending on device specifications. In one example, the adjustment (or step) of the first reading threshold voltage value is no less than 25 mV and no greater than 50 mV.

Figure 2B:
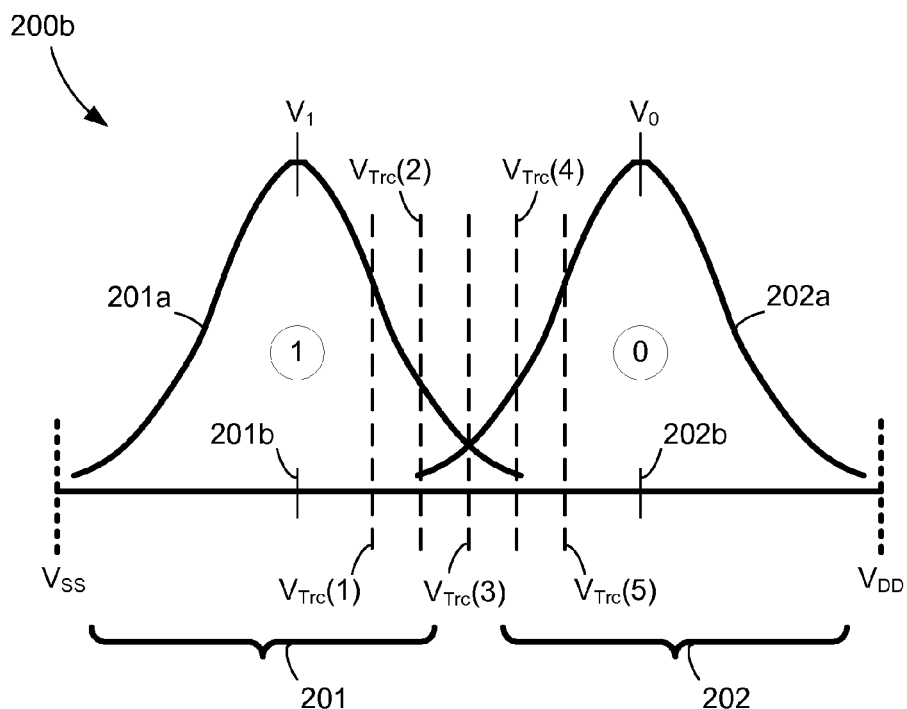
FIG. 2B is a prophetic diagram of voltage distributions that may be found in an SLC over time and reading threshold voltages that are applied to the SLC according to a recalibration, or feed forward equalization (FFE), process, in accordance with some embodiments.

FIG. 2B is a simplified, diagram of voltage distributions 200b found in a single-level flash memory cell (SLC) over time and reading threshold voltages $V_{Trc}(1)$, $V_{Trc}(2)$, $V_{Trc}(3)$, $V_{Trc}(4)$, $V_{Trc}(5)$ that are applied to the SLC according to a recalibration, or feed forward equalization (FFE), process. More generally, the recalibration (FFE) process uses a number (which may be greater than or less than five) of reading threshold voltages appropriate for the specific device or device portion on which the recalibration process is being performed. FIG. 2B is similar in all respects to FIG. 2A save the distinct reading threshold voltages $V_{Trc}(1)$, $V_{Trc}(2)$, $V_{Trc}(3)$, $V_{Trc}(4)$, $V_{Trc}(5)$. In some implementations, the magnitude (or step) between each respective reading threshold voltage is greater for the recalibration (FFE) process than for the reading threshold voltage adjustment (DFE) process. The recalibration (FFE) process can be used to correct for larger shifts in cell voltage than the shifts in cell voltage handled by the reading threshold voltage adjustment (DFE) process, and also to calibrate one or more reading threshold voltages when a predefined recalibration trigger condition is detected, as discussed in more detail below.

In some embodiments, a recalibration (FFE) process is enabled to recalibration or equalize a first reading threshold voltage, located in the transition or overlap between adjacent voltage ranges (e.g., voltage ranges 201 and 202) in the SLC, if a predefined condition occurs. As explained above with respect to FIG. 1A, data is read from a set of flash memory cells in accordance with one or more host read commands and a current value of the first reading threshold voltage (e.g., $V_{Trc}(3)$, which is a parameter value of a characterization vector associated with the flash memory cells). An ECC engine performs an error correction process on the read data to produce error correction information. In some embodiments, the controller initiates the recalibration, or FFE, process of one or more reading threshold voltages when a predefined condition occurs (e.g., the error correction information indicates that the ECC engine is unable to decode the read data or the number of errors exceeds a predefined error threshold).

In some embodiments, the recalibration process includes performing a plurality of read operations (or sensing operations), each with a different respective reading threshold voltage. In some implementations, the set of respective reading threshold voltages used during the recalibration process is predefined and independent of the current value of the first reading threshold voltage. In some other implementations, the set of respective reading threshold voltages used during the recalibration process is determined based on the current value of the first reading threshold voltage (e.g., $V_{Trc}(3)$). For example, and without limitation, the recalibration process includes four additional read operations including a first set of two read operations each with a respective reading threshold voltage less than (i.e., having voltages shifted toward $V_{SS}$) the current value of the first reading threshold voltage (e.g., $V_{Trc}(3)$) and a second set of two read operations each with a respective reading threshold voltage greater than (i.e., shifted toward $V_{DD}$) the current value of the first reading threshold voltage (e.g., $V_{Trc}(3)$). In this example, the values of the reading threshold voltages of the two read operations in the first set of read operations are $V_{Trc}(1)$ and $V_{Trc}(2)$, and the values of the reading threshold voltages of the two read operations in the second set of read operations are $V_{Trc}(4)$ and $V_{Trc}(5)$.

In some embodiments, the step size between respective reading threshold voltages (e.g., between neighboring reading threshold voltages in FIG. 2B) used during the recalibration process is at least 100 mV. In some embodiments, the number of read operations using different reading threshold voltages used during the recalibration process is at least four, and in some implementations is between 5 and 9.

In some embodiments, with respect to the FFE process, the controller formulates a histogram for a first reading threshold voltage by utilizing read data from the plurality of additional read operations and the read operation applying a current value of the first reading threshold voltage. In some embodiments, the value of the reading threshold voltage is adjusted to a value greater or less than the current value of the reading threshold voltage based on local minimal points of the histogram.

Figure 3A:
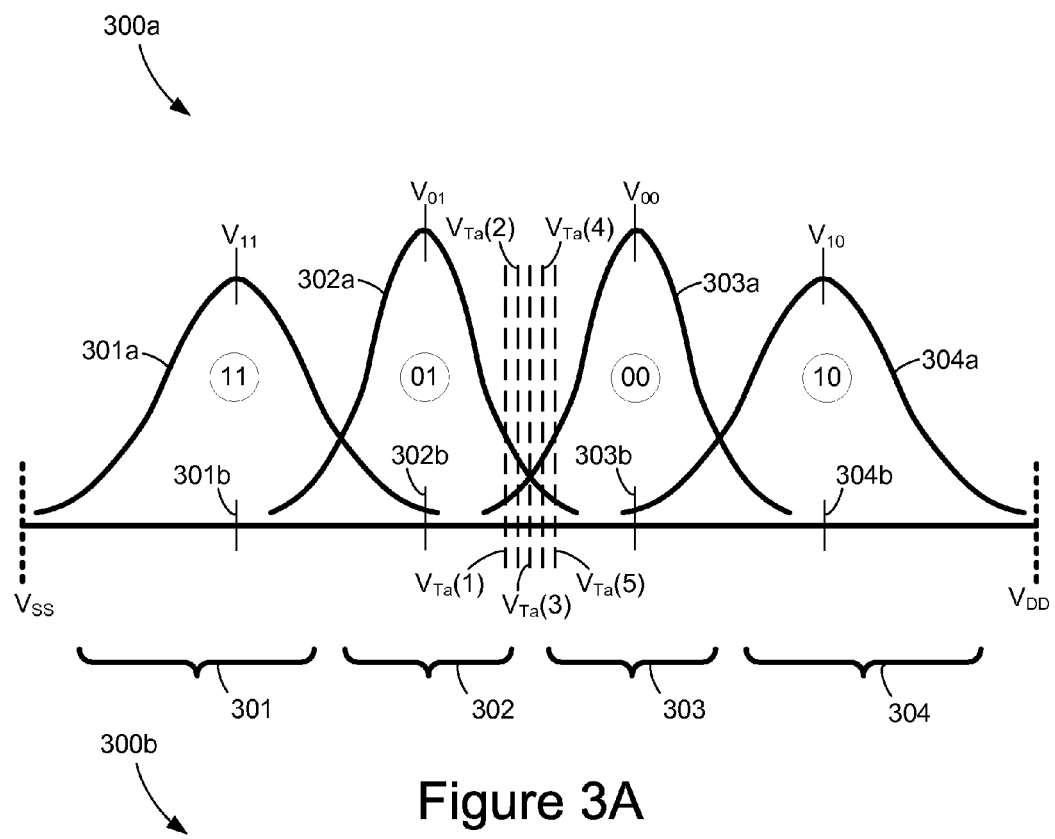
FIG. 3A is a prophetic diagram of voltage distributions that may be found in a multi-level flash memory (MLC) cell over time and reading threshold voltages that are applied to the MLC according to a reading threshold voltage refinement process, sometimes herein called a decision feedback equalization (DFE) process, for a lower page read, in accordance with some embodiments.
Figure 3B:
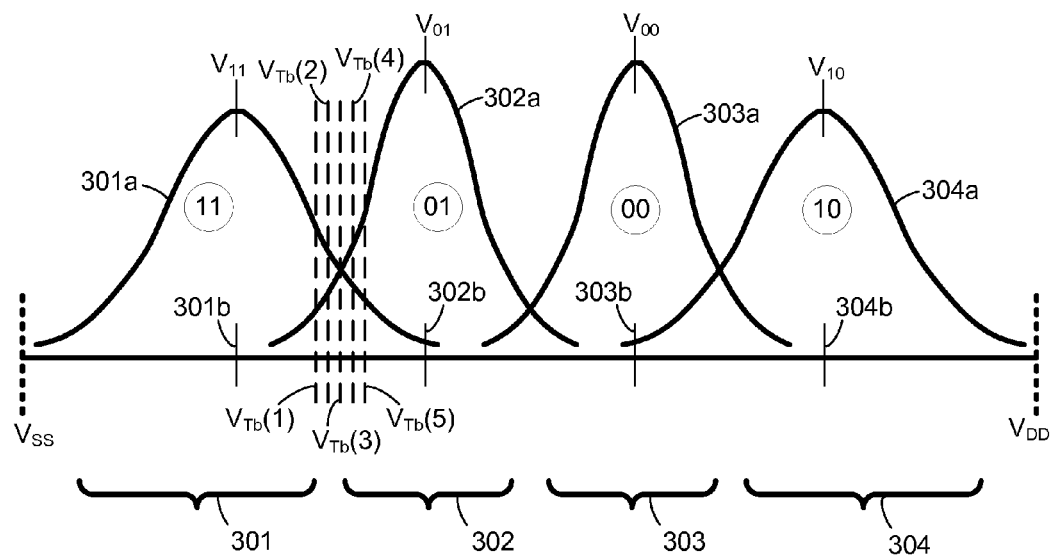
FIG. 3B is a prophetic diagram of voltage distributions that may be found in an MLC flash memory cell over time and reading threshold voltages that are applied to the MLC according to a reading threshold voltage refinement process, sometimes herein called a decision feedback equalization (DFE) process, for an upper page read, in accordance with some embodiments.

As discussed below with reference to FIGS. 3A-3B, a multi-level flash memory cell (MLC) is used to store multiple bits of information by using voltage ranges within the total voltage range of the memory cell to represent different bit-tuples. FIGS. 3A-3B illustrate an example in which 2-bit MLC is used to store 2 bits of information per memory cell. However, those skilled in the art will appreciate from the present disclosure that the 2-bit implementation may be extended to q-bit MLC flash memory which stores q bits of information per memory cell, where $q\geq 3$. An MLC memory device is typically more error prone than an SLC memory device created using an identical manufacturing process because the effective voltage difference between the voltages used to store different data values is smaller for an MLC memory device. Moreover, due to a number of error-inducing factors, a typical error includes the cell voltage of a particular MLC shifting to a voltage range that is adjacent to the voltage range that would otherwise be representative of the correct bit-tuple. Such error-inducing factors include, without limitation, pseudo-random electrical fluctuations, defects in the storage medium, operating conditions, device history (e.g., a count of the number of program-erase (P/E) cycles performed by the storage device), suboptimal performance or design and/or degradation of write-read circuitry, or a combination of these factors and optionally other factors. As discussed in greater detail below with reference to FIG. 3A-3B, the impact of such errors can be reduced by gray-coding the data, such that there are only single-bit changes between bit-tuples in adjacent voltage ranges.

For example, as shown in FIGS. 3A-3B, sequential voltage ranges 301, 302, 303, 304 between the source voltage, $V_{SS}$, and the drain voltage, $V_{DD}$, are used to represent corresponding bit-tuples "11," "01," "00," "10," respectively. Each voltage range 301, 302, 303, 304 has a respective center voltage 301b, 302b, 303b, 304b. Each voltage range 301, 302, 303, 304 also has a respective distribution of voltages 301a, 302a, 303a, 304a that may occur as a result of any number or combination of the error-inducing factors described above.

As noted above, errors in the cell voltage of an MLC and/or the cell voltage sensed are sometimes caused by the cell voltage drifting to a range corresponding to a different bit-tuple from the correct voltage range of the bit-tuple written to the MLC. One way to reduce the impact of a cell voltage drifting from one voltage range to an adjacent voltage range is to gray-code the bit-tuples. Gray-coding the bit-tuples includes constraining the assignment of bit-tuples to memory cell voltage ranges such that the respective bit-tuple of a particular voltage range is different from the respective bit-tuple of an adjacent voltage range by only one bit.

For example, as shown in FIGS. 3A-3B, the corresponding bit-tuples for the adjacent ranges 301 and 302 are respectively "11" and "01," the corresponding bit-tuples for the adjacent ranges 302 and 303 are respectively "01" and "00," and the corresponding bit-tuples for the adjacent ranges 303 and 304 are respectively "00" and "10." Using gray-coding, if a particular cell voltage drifts to an adjacent range, the error is typically limited to a single bit within the 2-bit bit-tuple. The probability that a particular cell voltage drifts beyond an adjacent range is typically small, for example much less than one percent, if not negligible.

As illustrated in FIGS. 3A-3B and as described throughout the present disclosure, the least significant bit (i.e., the right-most bit) of each bit-tuple corresponds to the "lower page" bit value of an MLC, and the most significant bit (i.e., the left-most bit) of each bit-tuple corresponds to the "upper page" bit value of the MLC. However, those skilled in the art will appreciate that in other implementations the relative positions of the upper and lower page bits can be exchanged. Moreover, under typical operating conditions, however, due in part to the factors described above, the actual cell voltage may differ from the center voltage for the data written to the MLC.

FIG. 3A is a simplified, prophetic diagram of memory cell voltage distributions 300a found in the memory cells of an MLC memory device over time and reading threshold voltages $V_{Ta}(1)$, $V_{Ta}(2)$, $V_{Ta}(3)$, $V_{Ta}(4)$, $V_{Ta}(5)$ that are applied to memory cells of the MLC memory device according to a reading threshold voltage refinement process (DFE process) for a lower page read, according to some implementations. Similar to an SLC, the cell voltage range of an MLC approximately extends from the voltage, $V_{SS}$, at the source terminal of a NMOS transistor to the voltage, $V_{DD}$, at the drain terminal of the NMOS transistor. As such, voltage distributions 300a extend between $V_{SS}$ and $V_{DD}$.

In some embodiments, the DFE process described above with respect to FIG. 2A is similarly enabled to adjust a first reading threshold voltage located in the transition or overlap between adjacent voltage ranges (e.g., voltage ranges 302 and 303) of an MLC for a lower-page read as shown in FIG. 3A. First, data is read from a set of flash memory cells in accordance with one or more host read commands and a current value of the first reading threshold voltage (e.g., $V_{Ta}(3)$, which is a parameter value of a characterization vector associated with the flash memory cells). Second, an ECC engine performs an error correction process on the read data to produce error correction information. Third, the controller determines whether to adjust the current value of the reading threshold voltage (e.g., $V_{Ta}(3)$). In some embodiments, the controller adjusts the value of the first reading threshold voltage if a number of errors indicated by the error correction information exceeds a predefined threshold. Fourth, the first reading threshold voltage is adjusted by setting the value of the first reading threshold voltage to a value greater (e.g., $V_{Ta}(4)$) or less than (e.g., $V_{Ta}(2)$) a current value of the first reading threshold voltage (e.g., $V_{Ta}(3)$). For example, if the number of "00" bit-tuples (where "00" is the corrected data value after application of the error correction process) read in error is greater than the number of "01" bit-tuples read in error, the current value of the first reading threshold voltage (e.g., $V_{Ta}(3)$) is shifted to $V_{Ta}(2)$ (e.g., towards $V_{SS}$).

FIG. 3B is a simplified, prophetic diagram of voltage distributions 300b that may be found in a multi-level flash memory cell over time and a sequence of reading threshold voltages $V_{Tb}(1)$, $V_{Tb}(2)$, $V_{Tb}(3)$, $V_{Tb}(4)$, $V_{Tb}(5)$ that are applied to memory cells of the MLC memory device according to a reading threshold voltage refinement process (DFE process) for an upper page read according to some implementations. The voltage distributions 210b illustrated in FIG. 3B are similar to and adapted from the voltage distributions 210a illustrated in FIG. 3A, but are located in the transition or overlap between adjacent voltage ranges 301 and 302, instead of voltage ranges 302 and 303 as in FIG. 3A.

In some embodiments, the DFE process described above with respect to FIG. 2A is similarly enabled to adjust a first reading threshold voltage located in the transition or overlap between adjacent voltage ranges (e.g., voltage ranges 301 and 302) of an MLC for an upper-page read shown in FIG. 3B. First, data is read from a set of flash memory cells in accordance with one or more host read commands and a current value of the first reading threshold voltage (e.g., $V_{Tb}(3)$, which is a parameter value of a characterization vector associated with the flash memory cells). Second, an ECC engine performs an error correction process on the read data to produce error correction information. Third, the controller determines whether to adjust the current value of the reading threshold voltage (e.g., $V_{Tb}(3)$). In some embodiments, the controller adjusts the value of the first reading threshold voltage if a number of errors indicated by the error correction information exceeds a predefined threshold. Fourth, the first reading threshold voltage is adjusted by setting the value of the first reading threshold voltage to a value greater (e.g., $V_{Tb}(4)$) or less than (e.g., $V_{Tb}(2)$) a current value of the first reading threshold voltage (e.g., $V_{Tb}(3)$). For example, if the number of "01" bit-tuples read in error is greater than the number of "11" bit-tuples read in error, the current value of the first reading threshold voltage (e.g., $V_{Tb}(3)$) is shifted to $V_{Tb}(2)$ (e.g., towards $V_{SS}$).

In some embodiments, the FFE process described above with reference to FIG. 2B is similarly applied to a lower-page read of memory cells of an MLC memory device illustrated in FIG. 3A and/or to an upper-page read of memory cells of an MLC memory device illustrated in FIG. 3B.

In some implementations, an additional reading threshold voltage located in the transition or overlap between adjacent voltage ranges 303 and 304 (e.g., a reading threshold for an upper page read) is adjusted using substantially the same methods and techniques as those described above with respect to the reading threshold voltage located in the transition or overlap between adjacent voltage ranges 301 and 302.

Figure 4A:
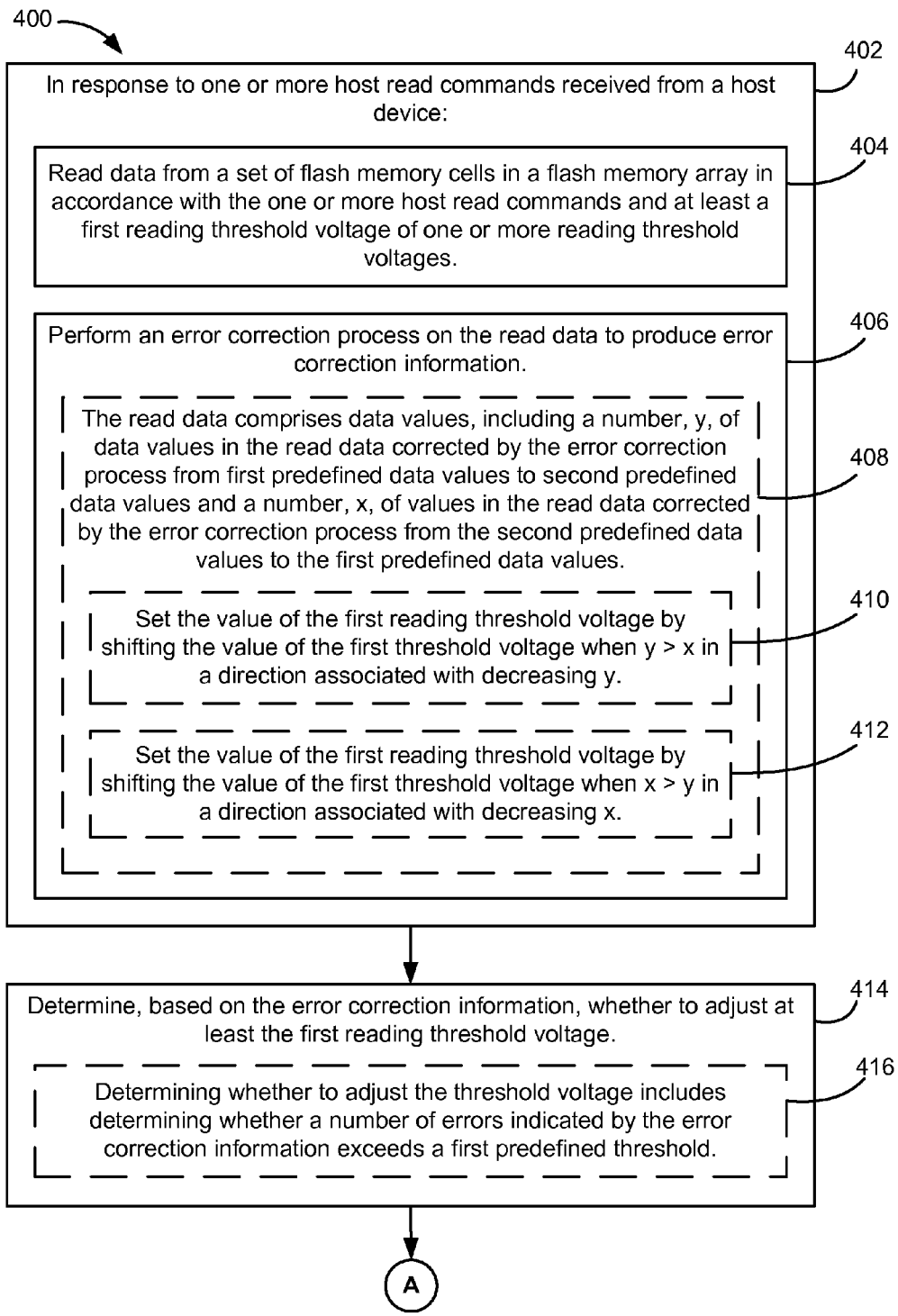
FIGS. 4A-4C illustrate a flowchart representation of a method for adjusting a reading threshold voltage, in accordance with some embodiments.
Figure 4B:
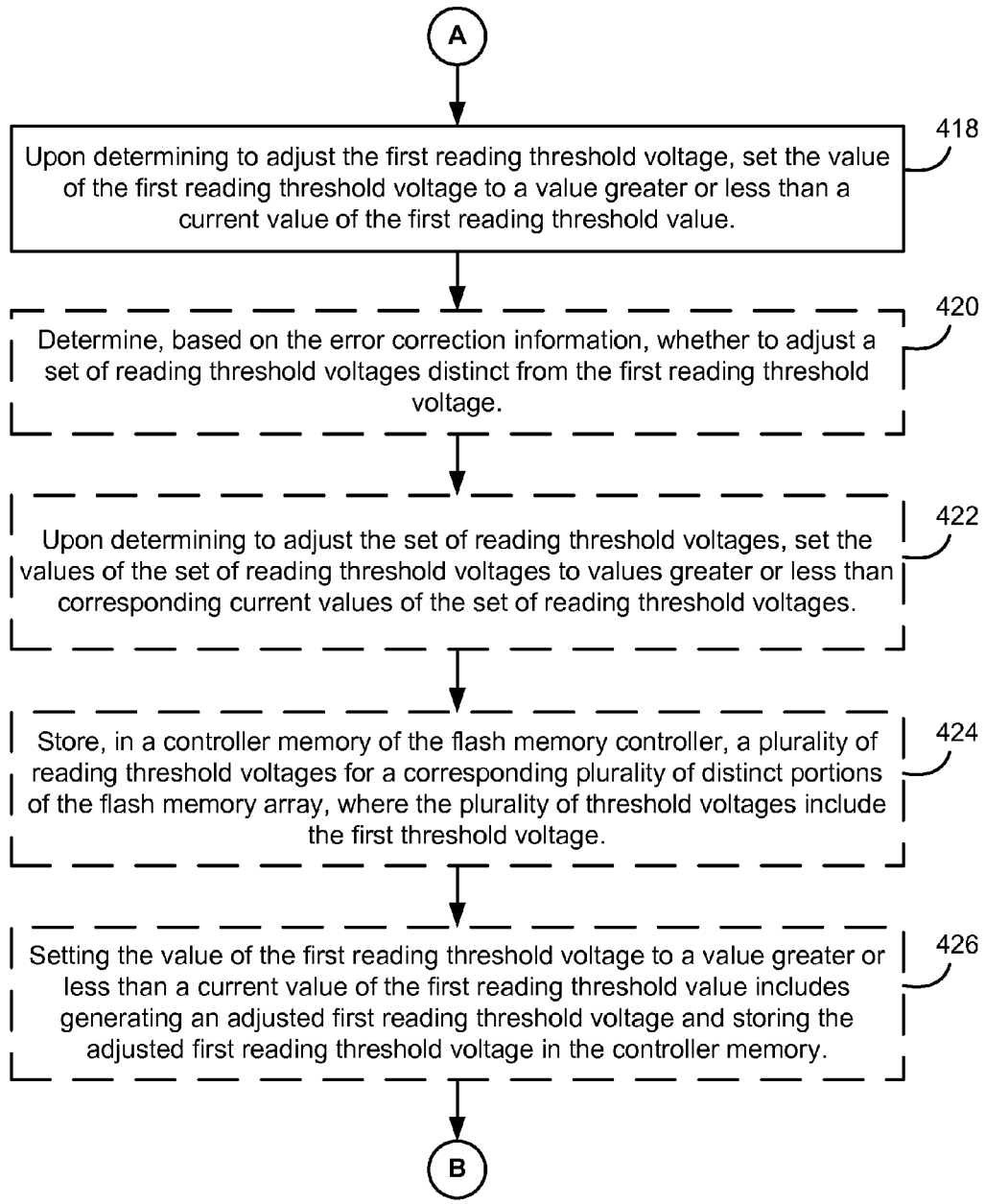
Figure 4C:
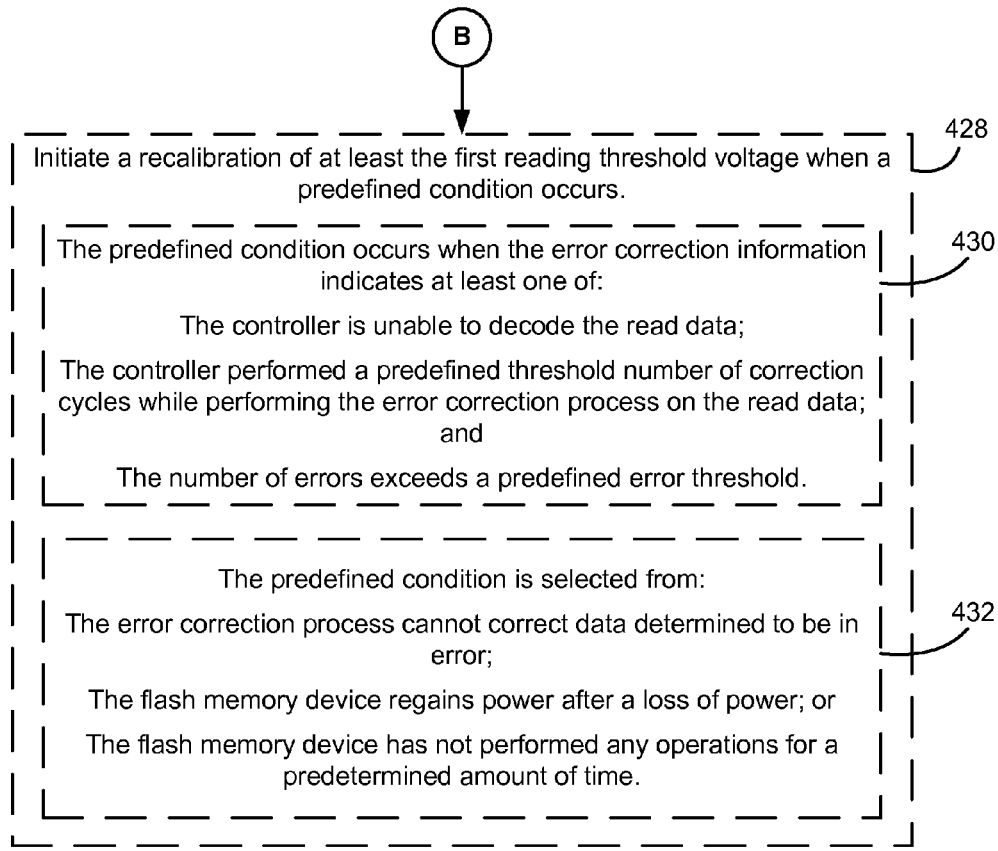

FIGS. 4A-4C illustrate a flowchart representation of a method 400 for adjusting one or more reading threshold voltages of a flash memory cell. In some implementations, method 400 is performed by a flash memory controller. Method 400 includes operations for processing one or more host read commands. In some embodiments, method 400 is governed by instructions that are stored in a computer readable storage medium and that are executed by one or more processors of a device, such as the one or more processing units (CPUs) 122 of management module 121, shown in FIGS. 1A-1B.

In response to one or more host read commands received (402) from a host device, the flash memory controller reads (404) data from a set of flash memory cells in a flash memory array in accordance with the one or more host read commands and at least a first reading threshold voltage of one or more reading threshold voltages. In some embodiments, the flash memory controller reads (404) data from a set of flash memory cells in a flash memory array by conveying a read command to the storage medium 130 (e.g., a flash memory device) that specifies the data to be read (e.g., specifying one or more logical block addresses, or one or more codewords, or one or more pages of data to be read, depending on the addressing scheme used by the storage medium 130), and also specifies the one or more reading threshold voltages to be used when performing the read operation. For example, the one or more reading threshold voltages are conveyed to storage medium 130 as digital values, either as part of the read command sent to the storage medium, or in a separate command that is conveyed to the storage medium before (or in conjunction with) the read command.

FIG. 1A, for example, shows memory controller 120 (e.g., a flash memory controller) enabled to receive one or more host read commands via control line 111 from computer system 110 (e.g., a host device) corresponding to a selectable portion (e.g., a memory location/address) of storage medium 130. In this example, management module 121 (a component of flash memory controller 120) issues one or more read access commands via storage medium I/O 128, in response to the one or more host read commands, to read data from a corresponding set of flash memory cells (e.g., a selectable portion of storage medium 131) in a flash memory array (e.g., storage medium 130). Management module 121 issues the one or more read access commands in accordance with a current value of a first reading threshold voltage (e.g., stored as a parameter value of a characterization vector 164) for the corresponding selectable portion of storage medium 131.

In response to one or more host read commands received from a host device, the flash memory controller performs (406) an error correction process on the read data to produce error correction information. FIG. 1A, for example, shows error control module 125 (a component of flash memory controller 120) configured to perform an error correction process (e.g., via decoder 127) on the read data (e.g., received via storage medium I/O 128) to produce error correction information. In some implementations, decoder 127 is enabled to perform the error correction process.

In some embodiments, the read data comprises data values, including a number, y, of data values in the read data corrected (408) by the error correction process from first predefined data values to second predefined data values and a number, x, of values in the read data corrected by the error correction process from the second predefined data values to the first predefined data values. For example, y is the number of data values in the read data corrected by the error correction process from first predefined data values or state A (e.g., a "0") to second predefined data values or state B (e.g., a "1"), and x is the data values in the read data corrected by the error correction process from second predefined data values or state B (e.g., a "1") to first predefined data values or state A (e.g., a "0").

In some embodiments, the flash memory controller sets (410) the value of the first reading threshold voltage by shifting the value of the first reading threshold voltage when y>x in a direction associated with decreasing y. Referring to FIG. 2A, for example, the value of the first reading threshold voltage is shifted from a current value of the first reading threshold voltage (e.g., $V_T(3)$) to adjusted value $V_T(4)$ when the number of data values in the read data corrected by decoder 127 from state A (e.g., a "0") to a state B (e.g., a "1") exceeds a number of data values in the read data corrected by decoder 127 from state B (e.g., a "1") to state A (e.g., a "0"). In some embodiments, the flash memory controller sets (412) the value of the first reading threshold voltage by shifting the value of the first reading threshold voltage when x>y in a direction associated with decreasing x. FIG. 2A, for example, shows management module 121 enabled to shift the value of the first reading threshold voltage from a current value of the first reading threshold voltage (e.g., $V_T(3)$) to adjusted value $V_T(2)$ when the number of data values in the read data corrected by decoder 127 from state B (e.g., a "1") to state A (e.g., a "0") exceeds the number of data values in the read data corrected by decoder 127 from state A (e.g., a "0") to state B (e.g., a "1").

The flash memory controller determines (414), based on the error correction information, whether to adjust a current value of at least the first reading threshold voltage. For example, reading threshold voltage refinement module 154 utilizes the error correction information from decoder 127 to determine whether to adjust the value of the first reading threshold voltage. In some embodiments, determining whether to adjust the reading threshold voltage includes (416) determining whether a number of errors indicated by the error correction information exceeds a first predefined threshold. For example, reading threshold voltage refinement module 154 adjusts a current value of the reading threshold voltage if the error correction information from decoder 127 indicates that the number of errors exceeds a first predefined threshold and, optionally, one or more additional criteria are satisfied. In some embodiments, if the number of errors indicated by the error correction information is less than or equal to the first predefined threshold then the reading threshold voltage refinement module 154 forgoes adjusting the current value of the reading threshold voltage.

Upon determining to adjust the first reading threshold voltage, the flash memory controller sets (418) the value of the first reading threshold voltage to a value greater or less than a current value of the first reading threshold value. For example, management module 121 sets the value of the first reading threshold voltage 166, stored as a parameter value of a characterization vector for the corresponding portion of storage medium 130, to a value greater or less than a current value of the first reading threshold value 166.

In some embodiments, the flash memory controller further determines (420), based on the error correction information, whether to adjust whether to adjust a set of reading threshold voltages distinct from the first reading threshold voltage, and upon determining to adjust the set of reading threshold voltages, the flash memory controller sets (422) the values of the set of reading threshold voltages to values greater or less than corresponding current values of the set of reading threshold voltages. In some embodiments, in addition to a first reading threshold voltage, second and third reading threshold voltages are each located in a respective overlap or transition between sequential voltage ranges 301, 302, 303, 304 of an MLC. To that end, for example with reference to FIG. 3A, the first reading threshold voltage (e.g., $V_{Ta}(3)$) is located in the overlap between voltage ranges 302 and 303, the second reading threshold voltage (not shown) is located in the overlap between voltage ranges 301 and 302 and the third reading threshold voltage (not shown) is located the overlap between voltage ranges 303 and 304. In some embodiments, the memory controller is configured to adjust more than three reading threshold voltages, where the storage medium consists of q-bit MLC for q≥3. For example, the memory controller is configured to adjust up to $2^q-1$ reading threshold voltages for q-bit MLC.

In some embodiments, the reading threshold voltage refinement process (DFE process) discussed above with respect to the first reading threshold voltage, applies mutatis mutandis to adjusting the set of reading threshold voltages distinct from the first reading threshold voltage. In some embodiments, the recalibration process (FFE process discussed) above with respect to the first reading threshold voltage, applies mutatis mutandis to recalibrating the set of reading threshold voltages distinct from the first reading threshold voltage.

In some embodiments, the flash memory controller stores (424) in a controller memory of the flash memory controller, a plurality of reading threshold voltages for a corresponding plurality of distinct portions of the flash memory array, where the plurality of reading threshold voltages include the first reading threshold voltage. FIG. 1B, for example, shows management module 121 (a component of flash memory controller 120) storing a plurality of reading threshold voltages 166 (including the current value of the first reading threshold voltage) as parameter values of characterization vectors 164 that correspond to a plurality of distinct portions (e.g., selectable portions of storage medium 131) of the flash memory array (e.g., storage medium 130). In this example, characterization vectors 164 within characterization module 162 are stored in management module 121's memory 142. In some implementations, the plurality of reading threshold voltages correspond to a plurality of distinct portions of the flash memory array, including reading threshold voltages for each distinct die, block, block zone, word line, word line zone (e.g., each of at least three word line zones, including a top edge region, a middle region and a bottom edge region) or page. In some implementations, characterization vectors 164 are stored in a memory local to storage medium 130.

In some embodiments, setting the value of the first reading threshold voltage to a value greater or less than a current value of the first reading threshold value further includes (426) generating an adjusted first reading threshold voltage and storing the adjusted first reading threshold voltage in the controller memory. For example, a current value of a first reading threshold voltage, stored as a parameter value of a characterization vector 164 corresponding to a distinct portion of storage medium 130, is replaced by an adjusted value of the first reading threshold voltage.

In some embodiments, the flash memory controller initiates (428) a recalibration of the first reading threshold voltage when a predefined condition occurs. For example, management module 121 initiates recalibration (FFE) module 156 when at least one of a set of trigger conditions 158 occur.

In some embodiments, the predefined condition occurs (430) when the error correction information indicates at least one of: the controller is unable to decode the read data; the controller performed a predefined threshold number of correction cycles while performing the error correction process on the read data; and the number of errors exceeds a predefined error threshold. In some embodiments, the predefined condition occurs when the error correction information indicates that the controller performed more than a predefined threshold number of correction cycles while performing the error correction process on the read data. For example, the predefined condition occurs when the error correction information indicates that an LDPC decoder (a component of the flash memory controller 120) performed more than N (e.g., 10, 15 or 20) iterative correction cycles. In some embodiments, the predefined condition occurs when the number of errors indicated by the error correction information exceeds a predefined error threshold. In some embodiments, the predefined error threshold is an error rate. Optionally, the predefined threshold is defined with respect to a maximum number of errors per codeword that can be reliably corrected using error control codes embedded in the codewords via an encoder.

In some embodiments, the predefined condition is selected (432) from: the error correction process cannot correct data determined to be in error; the flash memory device regains power after a loss of power; or the flash memory device has not performed any operations for a predetermined amount of time.

It will also be understood that, although the terms "first," "second," etc. may be used herein to describe various elements, these elements should not be limited by these terms. These terms are only used to distinguish one element from another. For example, a first contact could be termed a second contact, and, similarly, a second contact could be termed a first contact, which changing the meaning of the description, so long as all occurrences of the "first contact" are renamed consistently and all occurrences of the second contact are renamed consistently. The first contact and the second contact are both contacts, but they are not the same contact.

The terminology used herein is for the purpose of describing particular embodiments only and is not intended to be limiting of the claims. As used in the description of the embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The above description, for purpose of explanation, has been described with reference to specific implementations. However, the illustrative discussions above are not intended to be exhaustive or to limit the invention to the precise forms disclosed. Many modifications and variations are possible in view of the above teachings. The implementations were chosen and described in order to best explain the principles of the invention and its practical applications, to thereby enable others skilled in the art to best utilize the invention and various implementations with various modifications as are suited to the particular use contemplated.

What is claimed is:

1. A method, performed by a flash memory controller, for adjusting a reading threshold voltage of a flash memory cell, the method comprising:
in response to one or more host read commands received from a host device, reading data from a set of flash memory cells in a flash memory array in accordance with the one or more host read commands and at least a first reading threshold voltage of one or more reading threshold voltages, and performing an error correction process on the read data to produce error correction information;
determining, based on the error correction information and satisfaction of first criteria with respect to outcomes from performing the error correction process on the read data produced by reading data in response to the one or more host read commands, whether to adjust at least the first reading threshold voltage;
upon determining to adjust the first reading threshold voltage, performing a reading threshold voltage refinement operation that includes setting the value of the first reading threshold voltage to a value greater or less than a current value of the first reading threshold voltage; and
initiating a recalibration of at least the first reading threshold voltage of the one or more reading threshold voltages, wherein the recalibration is an operation distinct from the threshold voltage refinement operation, and the initiating is triggered by outcomes from performing the error correction process on the read data produced by reading data in response to the one or more host read commands, wherein the recalibration is triggered in accordance with a determination that the controller performed at least a predefined threshold number of correction cycles while performing the error correction process on the read data.

2. The method of claim 1, wherein the read data comprises data values, including a number, y, of data values in the read data corrected by the error correction process from first predefined data values to second predefined data values and a number, x, of values in the read data corrected by the error correction process from the second predefined data values to the first predefined data values, and setting the value of the first reading threshold voltage includes shifting the value of the first reading threshold voltage in a direction associated with decreasing y when y>x.

3. The method of claim 2, wherein setting the value of the first reading threshold voltage includes shifting the value of the first reading threshold voltage in a direction associated with decreasing x when x>y.

4. The method of claim 1, further comprising:
determining, based on the error correction information, whether to adjust a set of reading threshold voltages distinct from the first reading threshold voltage; and
upon determining to adjust the set of reading threshold voltages, setting the values of the set of reading threshold voltages to values greater or less than corresponding current values of the set of reading threshold voltages.

5. The method of claim 1, wherein determining whether to adjust the reading threshold voltage includes determining whether a number of errors indicated by the error correction information exceeds a first predefined threshold.

6. The method of claim 1, further comprising storing, in a controller memory of the flash memory controller, a plurality of reading threshold voltages for a corresponding plurality of distinct portions of the flash memory array, wherein the plurality of reading threshold voltages include the first reading threshold voltage.

7. The method of claim 6, wherein setting the value of the first reading threshold voltage to a value greater or less than a current value of the first reading threshold value includes generating an adjusted first reading threshold voltage and storing the adjusted first reading threshold voltage in the controller memory.

8. The method of claim 1, wherein the recalibration operation includes performing at least four additional reading operations that use different reading threshold voltages.

9. The method of claim 1, wherein a further recalibration of at least the first reading threshold voltage of the one or more reading threshold voltages is triggered in accordance with a determination that the flash memory device has not performed any operations, including read operations and write operations, for a predetermined amount of time.

10. A flash memory device, comprising:
flash memory, comprising a flash memory array of flash memory cells; and
a controller configured to:
in response to one or more host read commands received from a host device, read data from a set of flash memory cells in a flash memory array in accordance with the one or more host read commands and at least a first reading threshold voltage of one or more reading threshold voltages, and perform an error correction process on the read data to produce error correction information;
determine, based on the error correction information and satisfaction of first criteria with respect to outcomes from performing the error correction process on the read data produced by reading data in response to the one or more host read commands, whether to adjust at least the first reading threshold voltage;
upon determining to adjust the first reading threshold voltage, perform a reading threshold voltage refinement operation that includes setting the value of the first reading threshold voltage to a value greater or less than a current value of the first reading threshold voltage; and
initiate a recalibration of at least the first reading threshold voltage of the one or more reading threshold voltages, wherein the recalibration is an operation distinct from the threshold voltage refinement operation, and the initiating is triggered by outcomes from performing the error correction process on the read data produced by reading data in response to the one or more host read commands, wherein the recalibration is triggered in accordance with a determination that the controller performed at least a predefined threshold number of correction cycles while performing the error correction process on the read data.

11. The flash memory device of claim 10, wherein the read data comprises data values, including a number, y, of data values in the read data corrected by the error correction process from first predefined data values to second predefined data values and a number, x, of values in the read data corrected by the error correction process from the second predefined data values to the first predefined data values, and the controller is configured to shift the value of the first reading threshold voltage in a direction associated with decreasing y when y>x.

12. The flash memory device of claim 11, wherein setting the value of the first reading threshold voltage includes shifting the value of the first reading threshold voltage in a direction associated with decreasing x when x>y.

13. The flash memory device of claim 10, wherein the controller is further configured to:
   determine, based on the error correction information, whether to adjust a set of reading threshold voltages distinct from the first reading threshold voltage; and
   upon determining to adjust the set of reading threshold voltages, set the values of the set of reading threshold voltages to values greater or less than corresponding current values of the set of reading threshold voltages.

14. The flash memory device of claim 10, wherein determining whether to adjust the first reading threshold voltage includes determining whether a number of errors indicated by the error correction information exceeds a first predefined threshold.

15. The flash memory device of claim 10, the controller further including controller memory for storing a plurality of reading threshold voltages for a corresponding plurality of distinct portions of the flash memory array, wherein the plurality of reading threshold voltages include the first reading threshold voltage.

16. The flash memory device of claim 15, wherein setting the value of the first reading threshold voltage to a value greater or less than a current value of the first reading threshold value includes generating an adjusted first reading threshold voltage and storing the adjusted first reading threshold voltage in the controller memory.

17. The flash memory device of claim 10, wherein the recalibration operation includes performing at least four additional reading operations that use different reading threshold voltages.

18. The flash memory device of claim 10, wherein the controller is configured to initiate a further recalibration in accordance with a determination that the flash memory device has not performed any operations, including read operations and write operations, for a predetermined amount of time.

* * * * *